United States Patent
Ling

[11] Patent Number: 5,871,653
[45] Date of Patent: Feb. 16, 1999

[54] METHODS OF MANUFACTURING MICRO-LENS ARRAY SUBSTRATES FOR IMPLEMENTATION IN FLAT PANEL DISPLAY

[75] Inventor: Peiching Ling, San Jose, Calif.

[73] Assignee: Advanced Materials Engineering Research, Inc., Sunnyvale, Calif.

[21] Appl. No.: 802,736

[22] Filed: Feb. 20, 1997

Related U.S. Application Data

[60] Provisional application No. 60/029,200 Oct. 30, 1996.
[51] Int. Cl.[6] .............................. B29D 11/00; G02B 3/00
[52] U.S. Cl. .................................. 216/2; 216/24; 216/26; 359/642; 359/648; 359/729; 427/162; 427/163.2; 427/165; 430/296; 430/302; 430/321
[58] Field of Search ..................................... 359/729, 642, 359/648; 430/296, 302, 321; 427/162, 163.2, 165; 216/2, 24, 26

[56] References Cited

U.S. PATENT DOCUMENTS 5,148,322  9/1992  Aoyama et al. ........................ 359/708

*Primary Examiner*—Christopher L. Chin
*Attorney, Agent, or Firm*—Bo-In Lin

[57] ABSTRACT

Three process flows for manufacturing the micro-lens array substrates are disclosed. The process flows consist of two main parts. The first part of the process flows involves fabrication of a master mold. The first two process flows utilize photolithography means to print and dry etch the micro-lens array pattern on the substrate, which is covered by a oxidation or a wet etch stopping layer. The desired surface curvature corresponding to the desired size, shape, and pattern of the micro-lens array is created by either oxidizing the exposed silicon layer (in the first process flow) or to wet-etch the exposed SiO2 by using HF solutions (in the second process flow). The third process flow creates damaged areas by using a focused laser light at first. Then, the damaged areas are preferably etched by solutions, leaving the desired surface curvature. The second part of the process flows uses the master mold to make the secondary molds and third molds, and finally micro-lens array substrate through the conventional processes. Two applications of the micro-lens array substrates into flat panel display are also disclosed. First, to achieve wider viewing angle, higher resolution, higher brightness, and lower manufacturing cost, a conventional light diffuser and one substrate facing the viewer of two parallel transparent substrates sandwiching the liquid crystal in flat panel display can be replaced by a transparent micro-lens array substrate (or sheet) fabricated with the presently inventive process. Furthermore, a micro-lens array sheet made with the present inventive process flow can be attached such a substrate to reduce the manufacturing cost. Second, in a LCD utilizing phosphor elements as light source, a micro-lens array plate can be used to focus the UV light onto the phosphor elements for reduction of power consumption by the lamps.

35 Claims, 22 Drawing Sheets

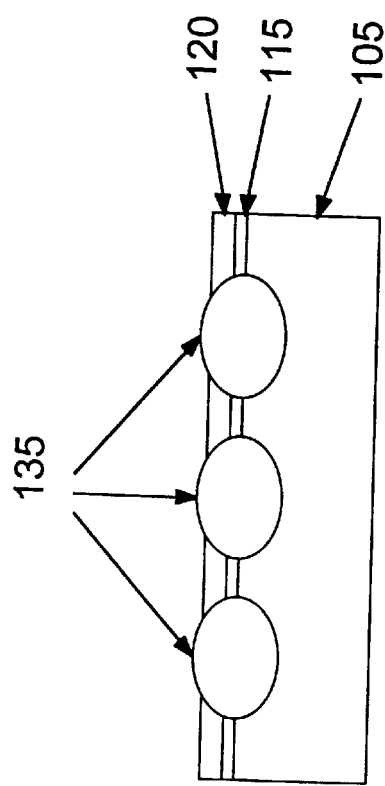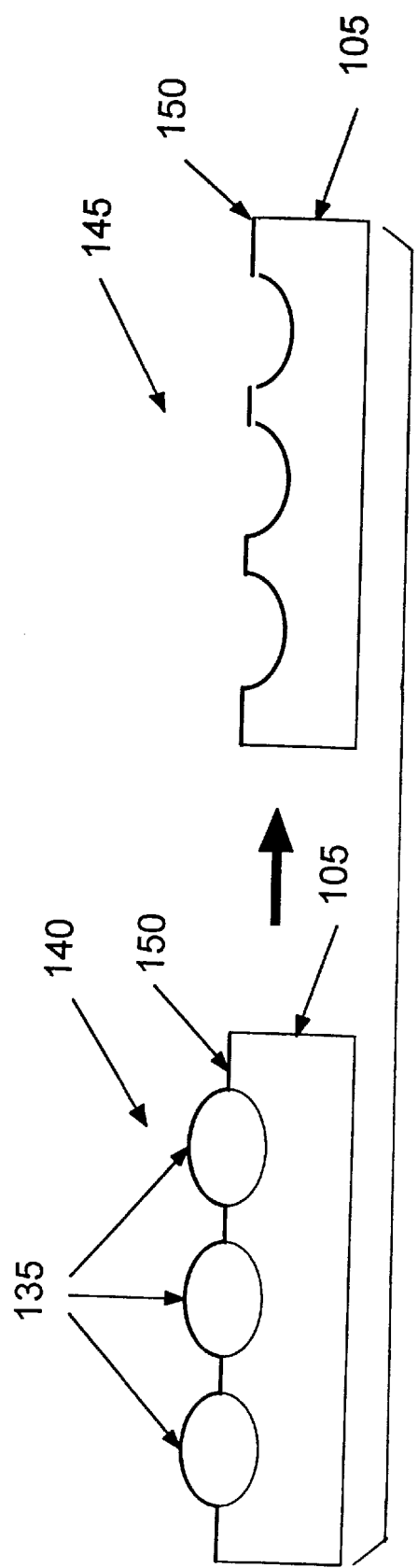

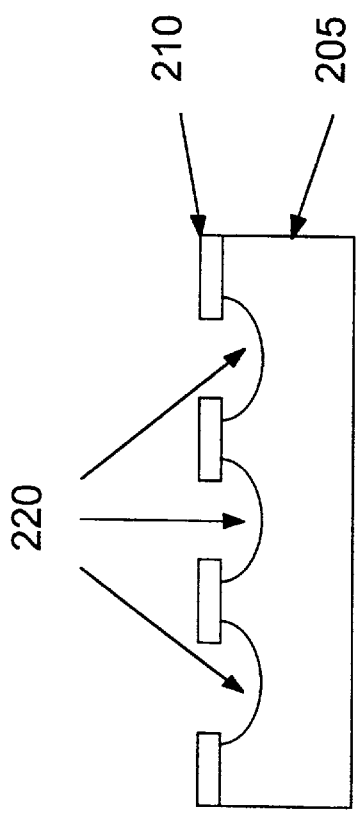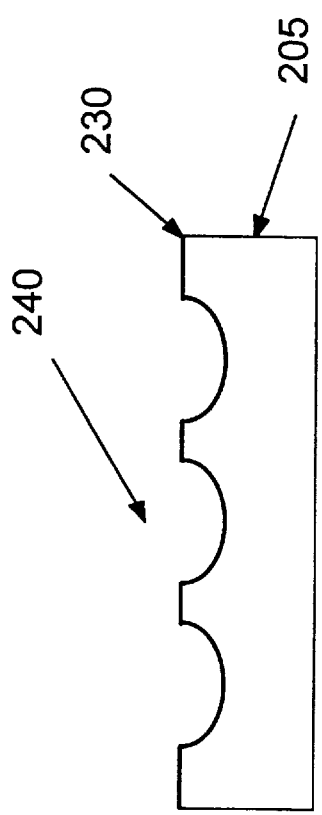

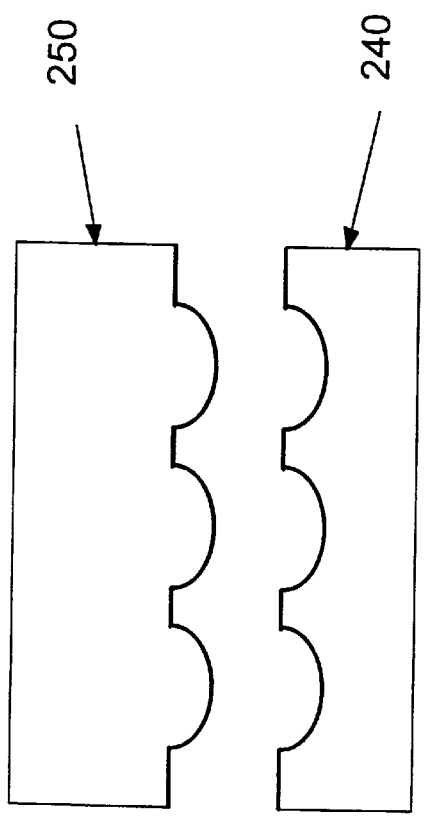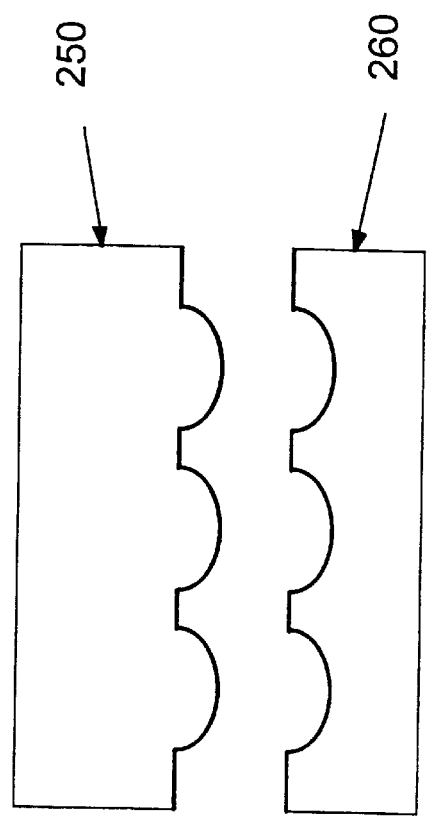

METHODS OF MANUFACTURING MICRO-LENS ARRAY SUBSTRATES FOR IMPLEMENTATION IN FLAT PANEL DISPLAY

A priority date of Oct. 30, 1996 benefited from a previously filed "Provision Application Ser. No. 60/029200" submitted by the same sole inventor is claimed for this Patent Application. The Provisional Patent Application has the same Attorney Docket Number.

BACKGROUND OF THE INVENTION

1. Field of the Invention

The present invention relates to the manufacture of micro-lens arrays on substrates and single micro-lens. More particularly, the present invention is related to novel processing techniques to achieve mass production of extremely small sized micro-lens down to deep sub-micron range with a lens-to-lens distance also in the deep sub-micron range wherein these micro lens arrays are manufactured with high throughput and very low cost.

BACKGROUND OF THE INVENTION

In spite of the fact that there are several conventional methods well known in the art for fabricating micro lens array on a substrate, the techniques of fabricating micro-lens array on substrates are still faced with several limitations and difficulties. Specifically the conventional techniques are either limited by the difficulties that either a) a high degree of sophisticated control is required in order to produce lenses with controllable optical characteristics or b) the manufacture processes are incompatible for mass production and therefore becomes not economical for mass-market applications, e.g., consumer product applications, and therefore are limited in its scopes of usefulness.

Two most widely used methods are molding polymerization and ion exchange diffusion. In a molding polymerization method, polymer powder is put into a mold with desired micro-lens array surface curvature on its surface and hot-pressed to form a substrate with micro-lens array. This method itself is cost-effective and simple. However, the manufacture of the mold with desired micro-lens curvature is an extremely difficult task, especially when lenses of irregular shape and small size, for instance less than 0.5 micron meter. Accurate control of good focus length requires time consuming adjustment process with high degree of manufacture skills. When an ion exchange diffusion method is employed, a mask layer of a necessary pattern made of materials such as a metal, is formed on the transparent flat glass substrate. This substrate with the mask layer is immersed in a salt solution bath. At this time, positive ions such as Na+ (sodium) ions) and K+ (potassium ions) contained in the glass are exchanged with the positive ions such as Ti+ (titanium ions) contained in the salt solution through the exposed surfaces of the glass. The ion exchanged regions have a different refractive index from the original refractive index of the glass, and thus form refractive index distribution regions having a light refracting action. However, this method is of limited usefulness since it can only be used on the glass substrate and process cannot be economically performed due to the limitation that the mask layer has to be formed on each individual substrate.

A few other new methods have been invented to fabricate such micro-lens array substrates. In U.S. Pat. No. 5,555,476, a micro-lens array sheet includes a first substance layer and a second substance layer having a refractive index less than that of the first substance layer, A plurality of minute unit lenses are formed by providing concave surface to an interface between the first and second substance layers. When a ray having entered into the sheet from the normal-line direction of the second substance layer exits from the surface of the first substance layer, an refractive angle relative to the normal line of the surface of the first substance layer is not less than 30 degree. It is claimed is that when micro-lens array sheet is attached to the surface of a liquid crystal cell of a liquid crystal display, an improved large angle of visibility can be obtained.

According to U.S. Pat. No. 5,536,455, a first array of lens-base elements is formed on a substrate with spacing there-between. The first lens-base elements are heated so that the first lens-base elements melt to form first lenses having round surface. A separation layer is formed to cover the first lenses and the substrate. A second array of second lens-base elements is formed, the second lens-base elements being placed on a region where the first lenses are not formed so as to partly overlap with the first lenses. The second lens-base elements are also heated so that the second lens-base elements melt to form second lenses having round surfaces. The lens array includes the substrate and the first and second lenses.

U.S. Pat. No. 5,324,623 disclosed a method of forming a micro-lens made of a thermoplastic resin on a solid-state imaging device, including the steps of forming a resist pattern having an open as a micro-lens forming portion on the solid-state imaging device; filling the opening with the thermoplastic resin; removing the resist pattern; and thermally deforming the thermoplastic resin on the opening. It is claimed that a micro-lens having a desired shape can be formed with a fine lens patter of 0.5 micron meter or less uniformly and highly accurately.

U.S. Pat. No. 5,300,263 disclosed a method of making a micro-lens array and mold, and the articles made therefrom. The method involves forming a plurality of adjacent receptacles on a surface and partially filling the receptacles with a harden-able liquid, thereby forming a meniscus in each receptacle. A lens material can then be applied to the menisci, thereby forming an array of generally spherical micro-lenses.

In U.S. Pat. No. 5,298,366, the micro-lens array producing method uses an intermediate material forming process for forming an intermediate material of photo-resist on a flat sheet, the intermediate material having projections formed in the shape of a predetermined patter; a resist master forming process of forming a resist master by heating the intermediate material to thereby smooth the surface of the projection, an inverted mold forming process for forming an inverted mold having a surface shape that is the inverse of the resist master; a clad portion forming process, for forming a clad portion having grooves equal in sectional shape to the inverted mold, using the inverted mold and also using a first light-transmitting material of a low refractive index; a process for forming micro-lenses by filling the concave portion of the clad portion with a second light-transmitting material which is higher in refractive index than the first light-transmitting material micro-lens with index than the first or the second light-transmitting.

According to U.S. Pat. No. 5,300,263, during a reactive ion etching process to make lens elements in a silica substrate, the gas constituency in the reactive ion etch chamber is changed to adjust the curvature of lens element formed in the silica substrate and to reduce the aberration of such lens elements. For example, two gases, $CHF_3$ and oxygen may be supplied to the reactive ion etch chamber and, during the reactive ion etch process, the proportion of the oxygen is significantly reduced, which reduces the aberrations of the lens elements formed by the process.

All the above inventions have some drawbacks. Every invention mentioned above has at least one of the following disadvantages; 1) low throughput; 2) high cost; 2) limited production; 4) large micro-lens size; 5) poor control of focus length, 6) inability to manufacture irregular shaped micro-lens.

Therefore, a need is still exists in the art of micro lens manufacture to provide a highly controllable mass production process flow to produce large amount of micro lens arrays with very small dimension at much reduced production cost such that these difficulties can be overcome. Furthermore, by achieving the goals of mass producing micro lens arrays with high quality and low cost, additional applications of the micro lens arrays can be more conveniently implemented for broad spectrum of optical and display devices. One specific application of the micro-lens array is to employ the array in a flat panel display to achieve wider viewing angle, higher resolution, higher brightness, and lower manufacturing cost. With the availability of low cost and high quality micro-lens array, a conventional light diffuser and a substrate facing the viewer of two parallel transparent substrates sandwiching the liquid crystal can now be replaced by a transparent micro-lens array substrate (or sheet) fabricated with the presently inventive process. Also, a micro-lens array sheet made with the present inventive process flow can be attached to such a substrate to reduce the manufacturing cost. In addition, for a LCD which utilizes phosphor elements as light source, a micro-lens array plate can be used to focus the UV light onto the phosphor elements whereby the power consumption by the lamps can be reduced.

BRIEF SUMMARY OF THE INVENTION

Accordingly, it is an object of the present invention to provide fabrication methods of micro-lens array on desired transparent substrates, such as glass and polymer.

It is still an object of the present invention to provide fabrication methods of micro-lens array of lens size as small as 0.1 micron meter with any desired shape.

It is still an object of the present invention to provide fabrication methods of micro-lens array to offer reliably massive production with high throughput and very low cost.

It is still an object of the present invention to provide fabrication methods of micro-lens array with controllable focus length.

It is still an object of the present invention to provide fabrication methods of micro-lens array being capable of produce both concave and convex micro-lenses.

It is still another object of the present invention to achieve, for the flat panel display, a wider viewing angle, higher resolution, higher brightness, and lower manufacturing cost, by replacing a conventional light diffuser and a substrate facing the viewer of two parallel transparent substrates sandwiching the liquid crystal by a transparent micro-lens array substrate (or sheet) fabricated with the presently inventive process.

It is still another object of the present invention to employ a micro-lens array plate in a LCD which utilizing phosphor elements as light source to focus the UV light onto the phosphor elements for reduction of power consumption by the lamps.

Three new process flows for manufacture of micro-lens array substrate are included in this invention. A brief summary of these processes are provided in this section while more detail descriptions of the invention are included in the section of "Detailed Description of the Invention".

In the first process flow, a poly silicon or amorphous silicon layer is deposited onto the original substrate, or a single crystalline Si wafer is used, followed by the thermal growth of a thin oxide (called pad oxide). A oxidation stopping film is then deposited onto the silicon layer or Si wafer. A photo-resist layer is coated above the oxidation stopping film, exposed to light through a mask, and developed to print a predetermined size, shape, and pattern of micro-lens onto the original substrate. The oxidation stopping film uncovered by photo-resist is etched away by dry etch and the etch may continues into Si layer or Si wafer to a predetermined depth thereafter. After strip of the remaining resist, the original substrate is put into a oxidation environment to oxide the exposed Si. During the oxidation, the exposed silicon becomes SiO2. Because the volume expansion during oxidation, a curvature is formed along the SiO2 surface. The desired curvature, therefore the focus length, can be adjusted by optimizing the combination of lens size, lens density, lens pattern, oxidation stopping film thickness, and oxidation conditions. Since this invention uses the photolithography processes widely used in IC manufacturing industry, size, density, and pattern of the micro-lenses can be readily produced.

In the next step, the oxidation stopping film is removed by the widely used methods, leaving a smooth surface consisting of $SiO_2$ and Si. An extra coating layer may be needed to protect the surface. This substrate with the desired micro-lens surface curvature is called the master mold. Then, a secondary mold with an inverted curvature is made from the master mold, and finally, a third mold with the same curvature as the master mold is made from the secondary mold. The substrate of the desired materials, including glass and polymers, are manufactured through a secondary or third mold, depending on whether the micro-lenses are convex or concave, by using the conventional methods, such as hot press, molding polymerization, and casting.

In the second process flow, a wet etch stopping film is deposited onto an original substrate, such as a glass or silica (SiO2) substrate. A photo-resist layer is then coated above the wet etch stopping film, exposed to light through a mask, and developed to print predetermined size, shape, and pattern of micro-lens array. The wet etch stopping film uncovered by photo-resist is etched away by dry etch and the etching may continues into the original substrate to a predetermined depth thereafter. After strip of the remaining resist, the original substrate is put into a solution that can wet etch original substrate, such as a solution containing HF. Uncovered SiO2 surface is etched away by the solution, leaving the curved surface on the original substrate surface. The desired curvature, therefore the focus length, can be adjusted by optimizing the combination of wet etch stopping film thickness, lens size, lens array pattern, solution type and concentration, etch time and temperature.

In the next step, the wet etch stopping film is removed by the widely used methods. An extra coating layer may be needed to protect the surface. This original substrate with the desired micro-lens surface curvature is called the master mold. Then, a secondary mold with an inverted curvature is made from the master mold, and finally, a third mold with the same curvature as the master mold is made from the secondary mold. The substrate of the desired materials, including glass and polymers, are manufactured through a secondary or a third mold, depending on whether the micro-lenses are convex or concave, by using the conventional methods, such as hot press, molding polymerization, and casting.

In the third process flow, a laser beam with predetermined size, wavelength, and energy is illuminated on a predetermined area of the original substrate for a predetermined time. Such illuminations are repeated following a predetermined pattern. After the illumination, the original substrate is put into a solution or dry etched to remove the part of the substrate underneath the illuminated area, leaving the curved surface on the original substrate surface. The desired curvature, therefore the focus length, can be adjusted by optimizing the combination of size, energy, time, and wavelength of the laser beam lens.

In the next step, an extra coating layer may be needed to protect the surface. This original substrate with the desired micro-lens surface curvature is called the master mold. Then, a secondary mold with an inverted curvature is made from the master mold, and finally, a third mold with the same curvature as the master mold is made from the secondary mold. The substrate of the desired materials, including glass and polymers, are manufactured through a secondary or a third mold, depending on whether the micro-lenses are convex or concave, by using the conventional methods, such as hot press, molding polymerization, and casting.

For all the three inventive process flows, a smaller original substrate (Master Mold) can be made at first The smaller size makes the manufacture of the original substrate much easier, resulting in the low manufacturing cost. The secondary and third molds can be fabricated by repeating pattern of the master mold.

Since a number of secondary molds can be made from the master mold and a number of third molds from the secondary molds, one master mold is able to produce thousands of micro-lens array substrates. This would lead to significant reduction in manufacturing cost because the process to make the master mold is very expensive and the processes to make the secondary mold, third mold, and micro-lens array substrate are the low cost ones.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIG. 3 is a cross-sectional view after oxidation of silicon.

FIG. 4 is a cross-sectional view of master mold.

FIG. 10 is a cross-sectional view after wet etch.

FIG. 11 is a cross-sectional view of master mold.

FIG. 12 is a cross-sectional view illustrating manufacture of a secondary mold from a master mold.

FIG. 13 is a cross-sectional view illustrating manufacture of a third mold from a secondary mold.

DETAILED DESCRIPTION OF THE INVENTION

Figure 1:
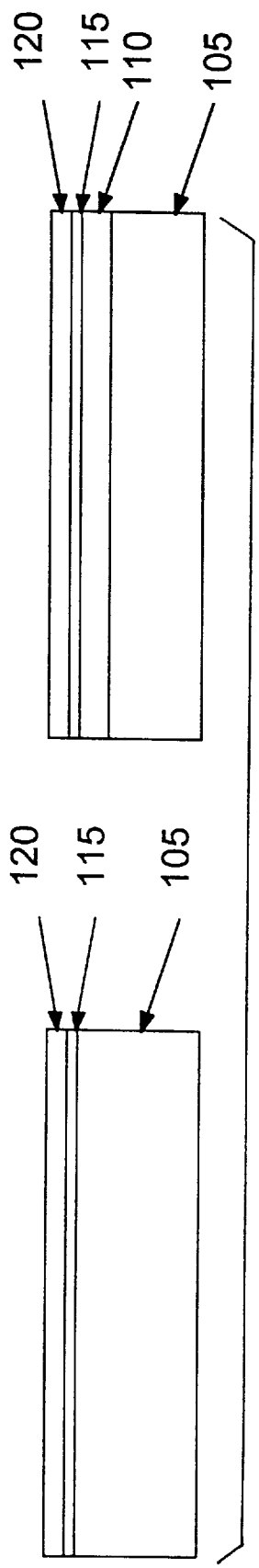
FIG. 1 is a cross-sectional view illustrating the original silicon substrate, pad oxide layer, and oxidation stopping layer.

Referring to FIGS. 1 to 7 for a first process flow of the present invention for manufacturing the micro lens array 100 on a substrate 105. A base layer 110 which can be a layer polycrystalline-silicon, i.e., "poly silicon", or amorphous silicon layer is deposited first on top of the substrate 105. An oxide layer 115 is thermally grown above the base layer 110. Deposition of the base layer 110 is optional and can be carried out by a chemical vapor deposition (CVD), or a plasma vapor deposition (PVD) or other processes which can be commonly employed in the manufacture of flat panel display (FPD) where a silicon thin film is used to control the light transmission value of a liquid crystal display system. An oxidation stopping layer 120 which may be a $Si_3N_4$ layer is then deposited on top of the oxide layer 115. The oxidation stopping layer is a thin layer, which has a thickness ranging from 100 to few thousands Angstroms depending on the micro lens characteristics, is deposited by the use of one of several layer formation processes, e.g., the chemical vapor deposition (CVD) process. The oxide stopping layer 120 is not reactive with the oxygen and therefore can serve as a barrier layer to prevent oxidation for the silicon layer 110 covered underneath the oxidation stopping layer 120. A photo-resist layer 125 is then coated over the oxidation stopping layer 120. The photo-resist layer 125 is then exposed to light through a mask which are patterned to expose areas with predetermined sizes, shapes, and locations to define a plurality of micro lens curvature windows on the substrate 105. The base layer 110, the oxide layer 115, and the oxidation stopping layer 120 constitute a micro lens curvature window defining layer to form a plurality of micro lens curvature window therein.

Figure 2:
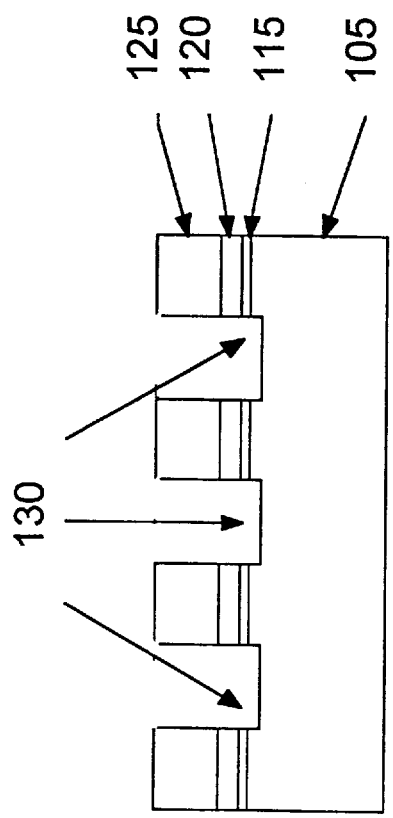
FIG. 2 is a cross-sectional view after dry etch removing oxidation stopping layer and some of silicon.

Referring now to FIG. 2, where a photolithography process is performed and an etch process is performed to etch away the oxidation stopping layer 120 in the areas where it is not covered by the photo-resist with a dry etching process. The layers are etched away to reach the silicon layer 110 at a specified depth into the layer to open a plurality of micro lens curvature windows 130. Depending on the light source employed in the photolithography, the areas opened a the micro lens curvature windows 130 by the etching process can have a width, or a diameter depending the shape of the curvature windows, ranging from few microns down to 0.1 micro meter. The depth of the curvature windows 130 etched into the silicon layer 110 can also be well controlled.

Referring to FIG. 3, the photo-resist layer 125 is removed and the substrate 105 together with the micro lens curvature windows 130 opened through the oxide layer 115 and the oxidation stopping layer 120 are placed into an oxidizing chamber to introduce oxygen at a controlled temperature. The surface of the silicon layer 110 at the curvature window 130 is oxidized to develop a silicon dioxide layer 135. The oxidization process is diffusion controlled by controlling the rate and oxygen diffusion directions to control the formation of an oxidation layer with desired surface curvature. Because of the stress redistribution and the characteristics of oxygen diffusion, more oxygen are caused to diffuse into the silicon surface areas near the central portions of the curvature window 130 and less in the area near the edges close to the oxidation stopping layer 120. Furthermore, because of the reaction expansion during the oxidization process a surface of curvature of the silicon dioxide layer 135 is formed. This phenomena of surface curvature due to the reaction expansion of the silicon dioxide layer 135 is commonly considered as an undesirable problem for IC manufacture processes because of the difficulty in critical dimension control when a field oxide layer develops a curved surface thus having variable heights. The curvature and the focal length can be controlled by optimizing the thickness of the silicon layer 110, the size and the depth of the curvature window 130, and the thickness of the silicon dioxide layer 135.

Figure 5:
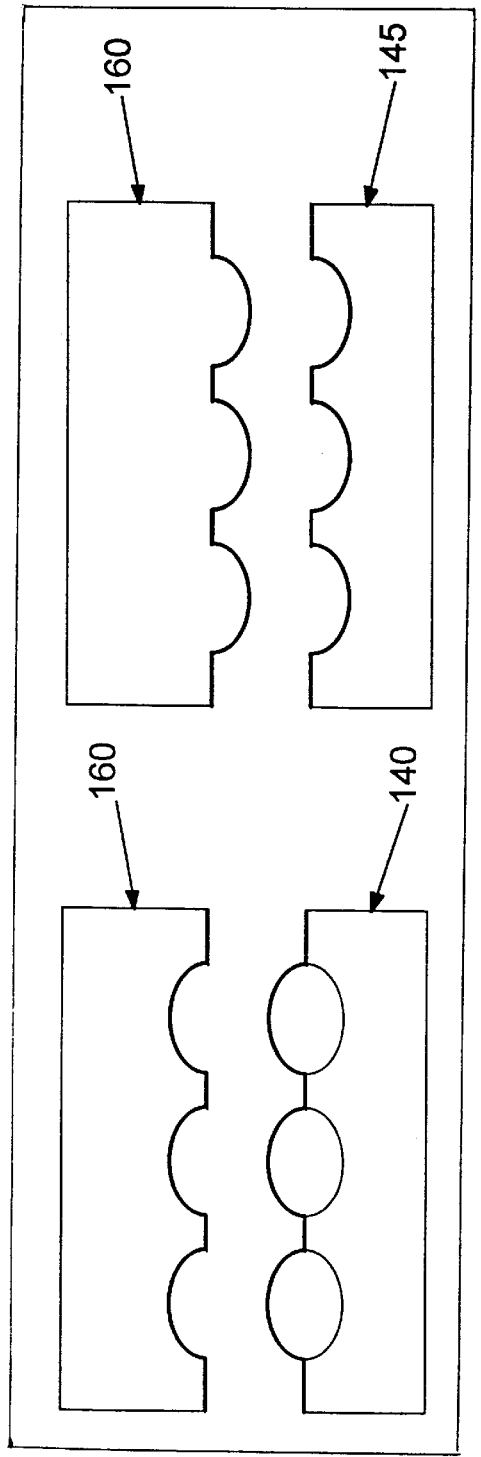
FIG. 5 is a cross-sectional view illustrating manufacture of a secondary mold from a master mold.
Figure 6:
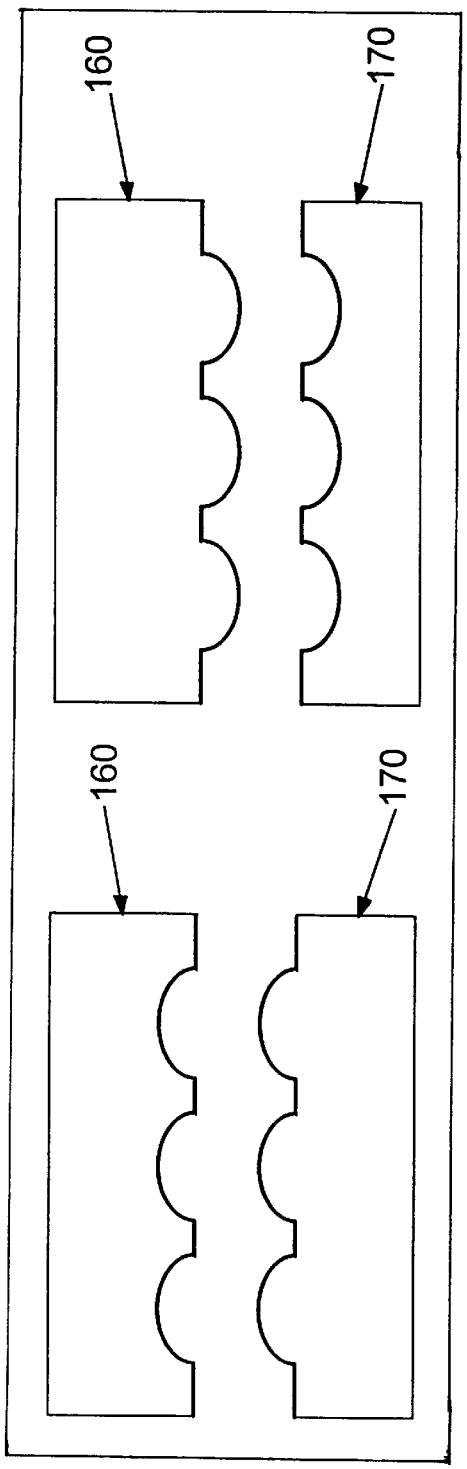
FIG. 6 is a cross-sectional view illustrating manufacture of a third mold from a secondary mold.
Figure 7:
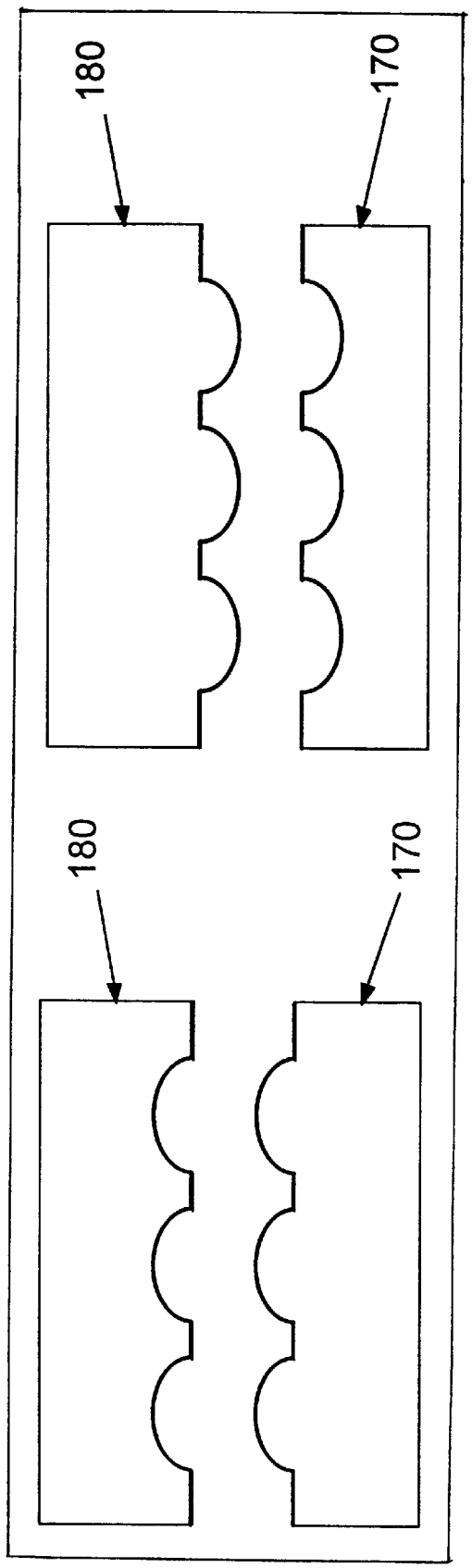
FIG. 7 is a cross-sectional view illustrating manufacture of a micro-lens array substrate from a third mold.

Referring to FIG. 4, the oxidization stopping layer 120 and the oxide layer 110 are removed and only two smooth layers of silicon dioxide layer 135 and the silicon layer 110 are supported on the substrate 105. With the surface curvature now generated on the surface of the silicon dioxide layer 135, the layers 135 and 110 now supported on the substrate 105 constituting a master mold 140. As shown in FIG. 4, the silicon dioxide layer 135 can be removed to make a different master mode 145 which has concave surface having a surface with curvature on the top. The master mode 140 may be covered with a very thin protective layer 150, e.g., a thin layer of silicon nitride. Referring to FIGS. 5 to 7, the master mold 140 or 145 are applied to form a second mold 160 or a third mold 170. These second or third molds can be manufactured by the use of conventional methods such as polymerization, hot press or casting with materials such as glass, or polymers. The details of making the molds and the formation of micro lens arrays by the use of these molds are already described in several prior art patents including few of them discussed in this patent application in the above section of the "Background of the Invention".

By first make such a master mold 140 and 145 available with high degree of precision and very small size, e.g., down to sub-micron width, the master mold 140 and 145 are now available to make large volume of substrate with micro-lens arrays thus greatly reducing the production costs of the micro lens array on substrates. The present invention thus discloses a technique to manufacture the micro lens array by a mass production method which is precisely controllable for making very small lenses at a very low production cost.

Thus, the present invention discloses a micro-lens curvature window 130 supported on a substrate 105 with an curvature defining layer disposed thereon. The micro lens curvature window 130 includes an opening in the curvature defining layer provided for forming a micro lens therein. This invention further discloses a micro-lens supported on a substrate with a micro lens curvature defining layer disposed thereon. The micro lens includes an opening 130 in the curvature defining layer. The micro lens further includes a micro lens layer 135 with a layer surface having a lens curvature composed with a transparent material, e.g., silicon dioxide, disposed in the opening 130. In a preferred embodiment, the curvature defining layer including an isotropic etching stopping layer 120.

This invention further teaches a method for manufacturing a micro-lens on a substrate. The method includes the steps of (a) forming a micro lens curvature defining layer on the substrate 105; (b) opening a micro lens curvature window 130 in the curvature defining layer; and (c)employing a transparent material, e.g., silicon dioxide, for forming a micro lens layer 135 with a layer surface having a lens curvature in the micro lens curvature window 130. In a preferred embodiment, the step of forming a micro lens layer 135 is a step of forming an oxidation layer 135 in the micro lens curvature window 130. In yet another preferred embodiment, the step of forming a micro lens curvature defining layer on the substrate is a step of forming a micro lens curvature defining layer including an oxidation stopping layer 120. In yet another preferred embodiment, the step of opening a micro lens curvature window in the curvature defining layer is a step of opening the window by applying a photolithography process to define the micro lens curvature window 130.

Figure 8:
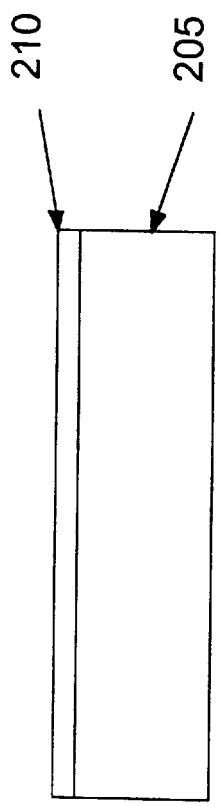
FIG. 8 is a cross-sectional view illustrating the original substrate, and wet etch stopping layer.

Referring to FIG. 8 now for a second process flow for making micro lens array of the present invention on a substrate 205. The surface of the substrate 205 is processed by such method as chemical mechanical polishing (CMP) process, to assure that the substrate 205 has a smooth top surface. A wet etch stopping layer 210 is deposited on top of the substrate 205. The wet etch stopping layer 210 may be a very thin layer composed of silicon nitride which is deposited by a chemical vapor deposition (CVD) or other layer formation process. This wet etch stopping layer protect the silicon substrate 205 covered under the etch stopping layer 210 from being exposed to oxygen according to the process flow to be further described below. A photo-resist layer 215 is coated above the wet etch stopping layer 210 which is then exposed to light through a mask (not shown) patterned with specially configured openings of sizes and shapes at pre-designated locations for making micro lens array.

Figure 9:
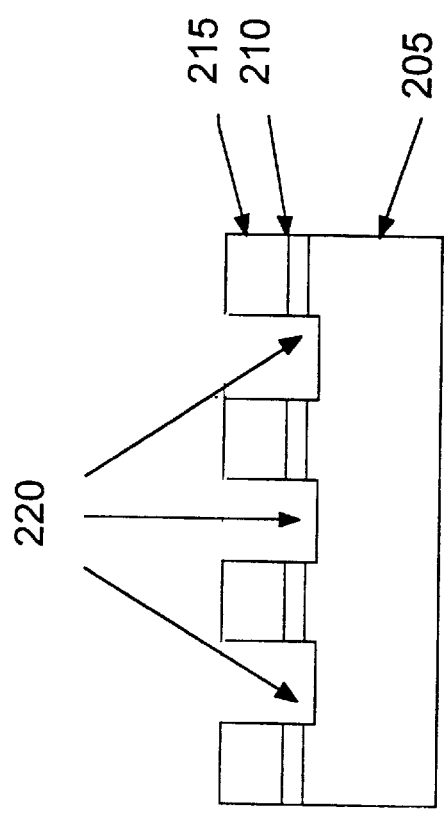
FIG. 9 is a cross-sectional view after dry etch removing wet etch stopping layer and some of the original substrate.

Referring now to FIG. 9, a photolithography process is carried out to define a plurality of micro lens curvature windows on the surface of the photo-resist layer 215. A wet etch process is then carried out to etch away a plurality of micro lens curvature windows 220 cutting through the photo-resist layer 215, the wet etch stopping layer 210 into the silicon substrate layer 205. Depending on the light applied in the photolithography process, the etchants, and the time of etch, the curvature window 220 can be controlled with high degree of precision to control the width and depth wherein the width of the curvature windows can be made between few microns down to deep sub-micron range, e.g., down to a dimension of approximately 0.1 micron meter.

Referring to FIG. 10 where the photo-resist layer 215 is removed and the substrate 205 with the wet etching stopping layer 210 and a plurality of micro lens curvature windows 220 are placed in a solution containing HF at a controlled temperature for specific length of time. The HF will react homogeneously with the exposed surface of the silicon substrate in the curvature windows 220. Because of the differences in surface tension of the solution cover the curvature window 220, the center portions of the windows 220 will have higher reaction rates than the edge near the wet etch stopping layer 210. The solution containing HF will then etch away the surface of the substrate 205 inside the curvature window 220 and develops a surface with certain curvature as that shown in FIG. 10. These surfaces of curvature produced by wet etching is a well known and undesirable problem for the IC manufacture because of the difficulty in dimension control as a result of the surface profiles with these curvatures. Dry etch has therefore replaced the wet etch process in order to avoid this problem. The curvature produced by the wet etch process as shown in FIG. 10 is however advantageously applied to produce micro lens curvature windows 220 of very small dimension provided with highly controllable manufacture precision. The wet etch process as applied in this process flow also provides another advantage that the required temperature is lower and can be more conveniently carried out. In FIG. 11, the etch stopping layer 210 is removed thus leaving the surface of curvature on the substrate 205. A protective coating 230 of very thin thickness may be formed on the top surface to protect the surface as a master mold 240 for making a large number of micro lens arrays.

In summary, the present invention further discloses a micro-lens curvature window 220 supported on a substrate with an curvature defining layer disposed 210 thereon. The micro lens curvature window includes an opening in the curvature defining layer 210 provided for forming a micro lens therein and the curvature defining layer including an isotropic etching stopping layer 210.

This invention also discloses a micro-lens supported on a substrate 205 with a micro lens curvature defining layer 210 disposed thereon. The micro lens includes an opening 220 in the curvature defining layer 210. The micro lens further includes an isotropic-etched surface through the opening 220 with a lens curvature disposed over a top surface of the substrate 205.

A method for manufacturing a micro-lens on a substrate is also disclosed in the present invention which includes the steps of (a) forming a micro lens curvature defining layer 210 including an etch stopping layer therein on the substrate 205; (b) opening a micro lens curvature window 220 in the curvature defining layer 210; and (c)applying an isotropic etch through the curvature window 220 for forming a micro lens layer with a lens surface having a lens curvature over a top surface of the substrate 205 in the micro lens curvature window 220. In a preferred embodiment, the step of applying an isotropic etch through the curvature window is a step of applying a wet isotropic etching process to form the lens surface over the top surface of the substrate in the micro lens curvature window. In yet another preferred embodiment, the step of forming a micro lens curvature defining layer on the substrate is a step of forming a micro lens curvature defining layer including a wet etch stopping layer 210. In yet another preferred embodiment, the step of opening a micro lens curvature window 220 in the curvature defining layer is a step of opening the window by applying a photolithography process to define the micro lens curvature window.

Figure 14:
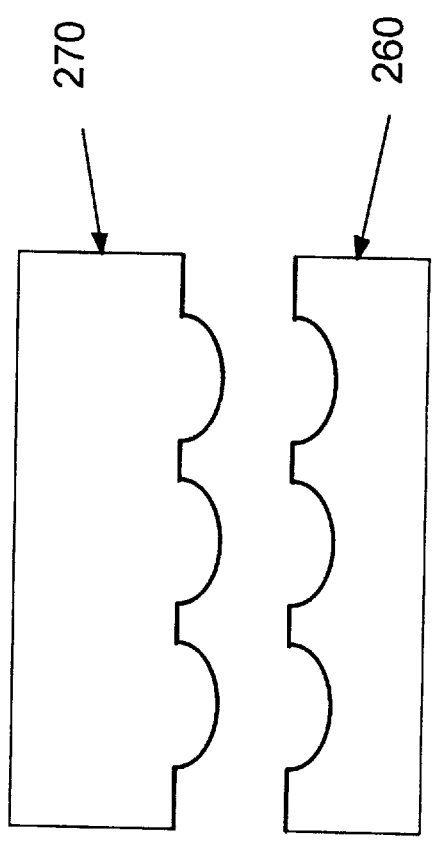
FIG. 14 is a cross-sectional view illustrating manufacture of a micro-lens array substrate from a third mold.

Referring to FIGS. 12 to 14 where the master mold 240 is employed to make a large number of secondary modes of reverse curvature, i.e., of convex curvature, and third molds 250 of the same curvature, i.e., of concave curvature, from the secondary modes 240. Large number of modes can be produced by the use of several processes such as polymerization, hot press or casting with materials such as glass, or polymers. As large number of micro lens arrays can be produced from these molds, mass production of micro lens array is feasible which provides a method to produce the micro lens array at a very low cost for different applications without being limited by the high production costs as that faced by the prior art technology.

In addition to the micro lens arrays described above, a plurality of micro-trenches can also be formed by applying the above processing steps. Instead of a spherical curvature surface as described above for the micro-lens array, a cylindrical type of curvature surfaces may be formed by forming a plurality of trenches. The trenched curvature surface has a special configuration feature that an the it has a dominant greater dimension along one particular direction, e.g., the longitudinal direction of a cylinder which often provides an advantage that the manufacture processes are generally easier to precisely control. However, due to the special geometry of the trenches, the deflection of the light is not as uniform as the micro lens array.

Figure 15:
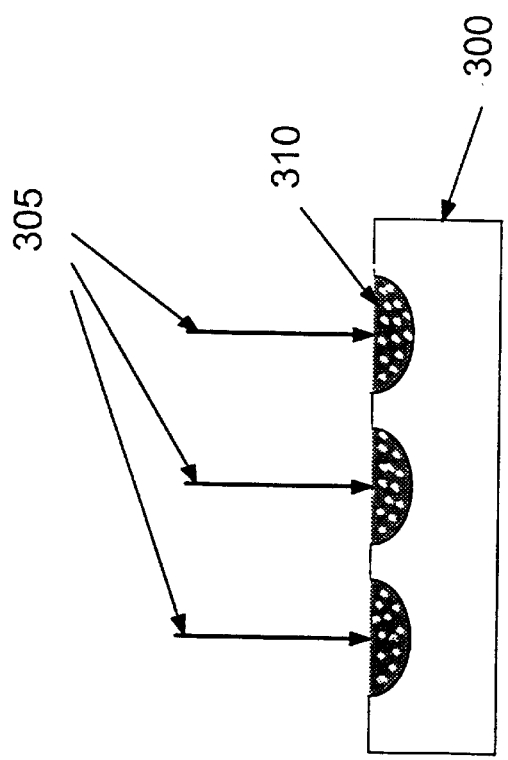
FIG. 15 is a cross-sectional view illustrating laser induced damage volume in the original substrate.
Figure 16:
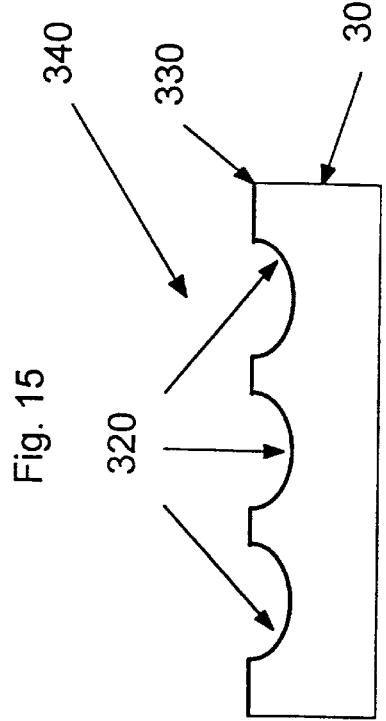
FIG. 16 is a cross-sectional view of master mold.
Figure 17:
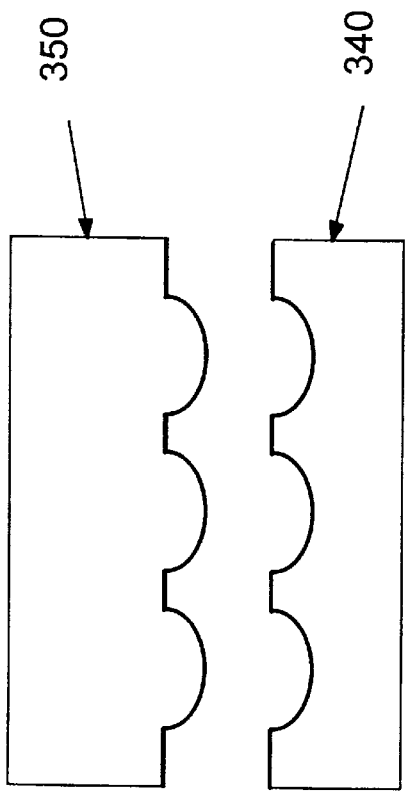
FIG. 17 is a cross-sectional view illustrating manufacture of a secondary mold from a master mold.
Figure 18:
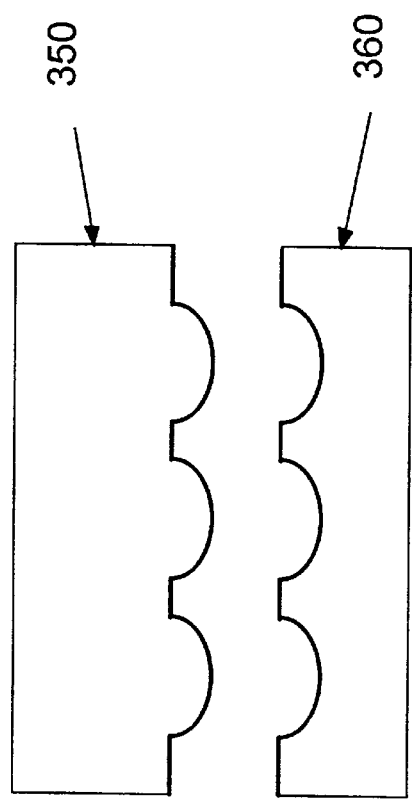
FIG. 18 is a cross-sectional view illustrating manufacture of a third mold from a secondary mold.
Figure 19:
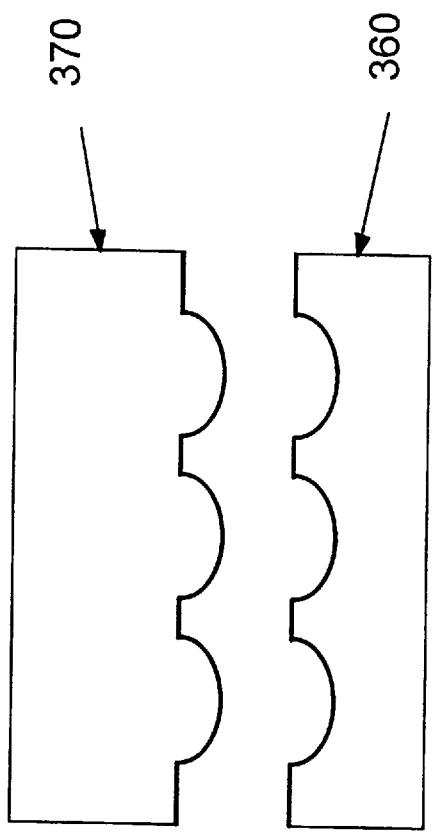
FIG. 19 is a cross-sectional view illustrating manufacture of a micro-lens array substrate from a third mold.

Referring now to FIG. 15 for another preferred embodiment showing a novel processing method to manufacture micro lens array on a substrate. A substrate 300 which is reactive to a process beam 305 which may be a laser beam, en electron beam (e-beam), an ion beam, or other type of process beam which may be irradiated by these beams to generate a plurality of damaged zones surrounded by a curvature boundary. The substrate 300 is exposed to a process beam, e.g., a laser beam 305 which is precisely controlled to produce a plurality of damaged etchable lens regions 310 below the top surface of the substrate 300. These damaged etchable lens regions 310 are made with precisely controlled curvature and sizes at pre-designated locations. After the exposure to the laser beam 305, the substrate is etched with a dry etch or wet etch process to etch away the damaged etchable lens regions as that shown in FIG. 16 thus producing a surface with a plurality of concave lens surface 320. A protective thin layer 330 is then formed on top of the top surface of the substrate which is now becomes a first master mold 340 to make a plurality of secondary or third mold to mass produce a large quantity of micro lens arrays on the substrate. As shown in FIGS. 17 to 19, the first master mold 340 is employed to make a secondary mold 350, a third mold 360 and a fourth mold 370.

Figure 20:
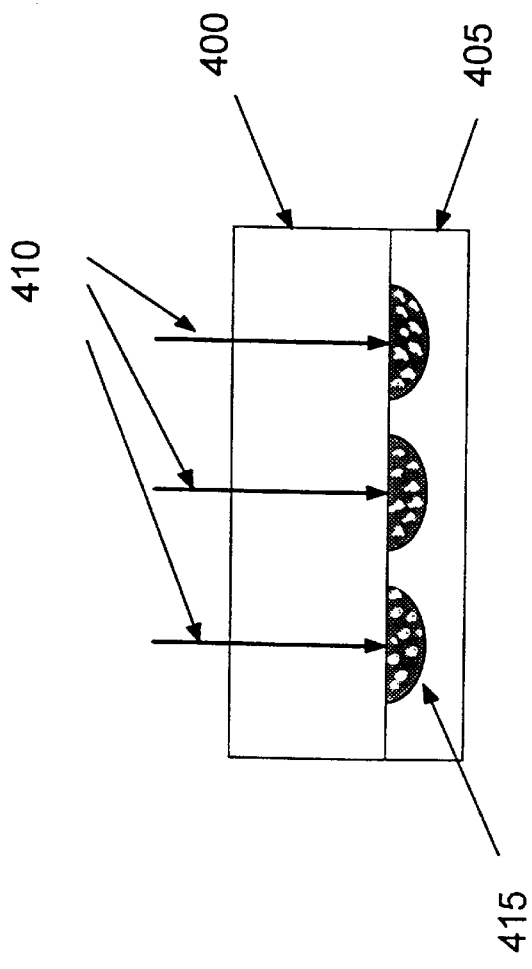
FIGS. 20 to 21 are cross-sectional views illustrating another beam processed method to induce damage zones in the top surface of a substrate.
Figure 21:
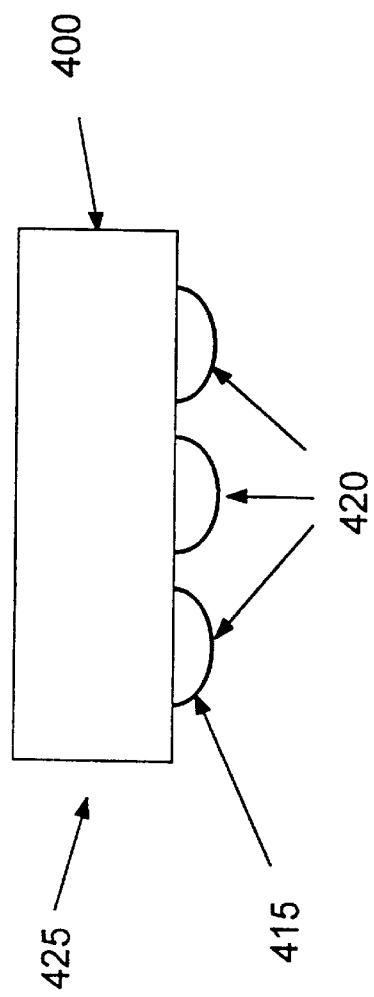
Figure 22:
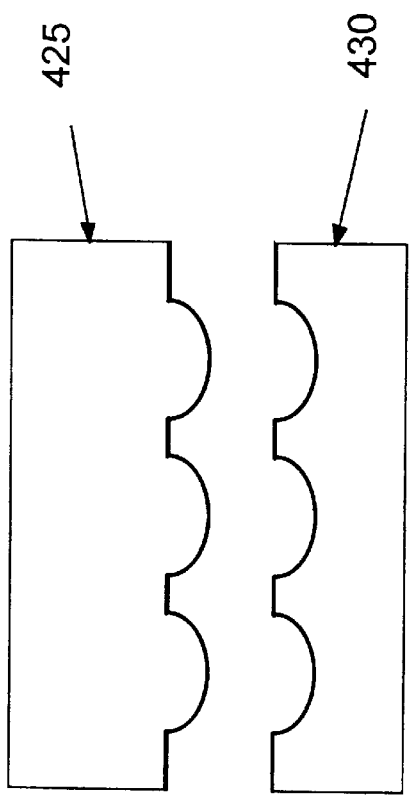
FIG. 22 is a cross-sectional view illustrating manufacture of a secondary mold from a master mold.
Figure 23:
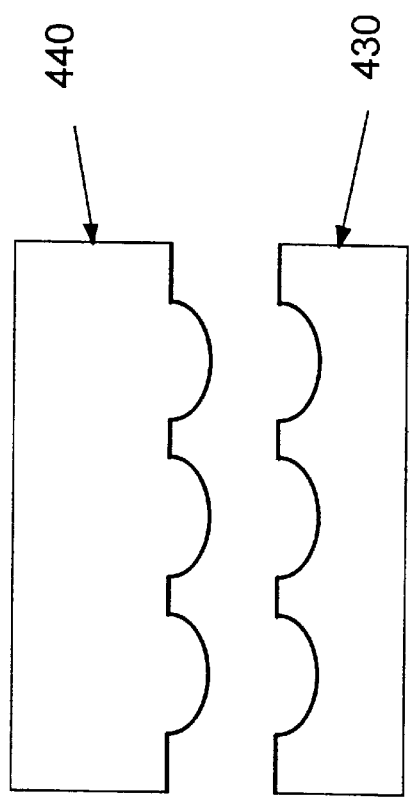
FIG. 23 is a cross-sectional view illustrating manufacture of a third mold from a secondary mold.
Figure 24:
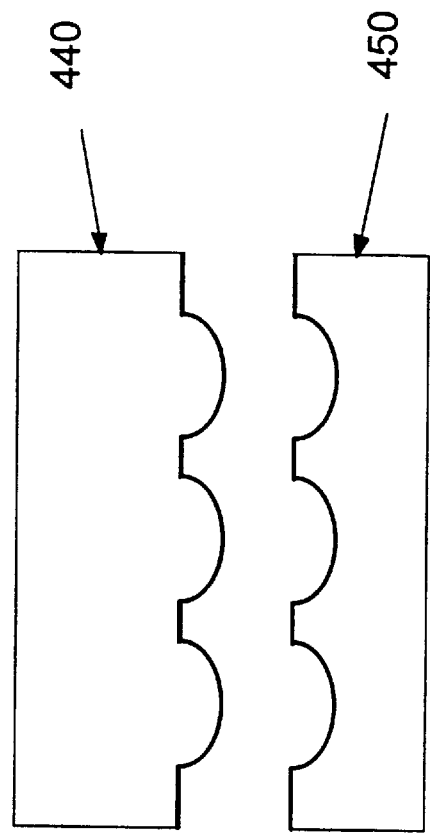
FIG. 24 is a cross-sectional view illustrating manufacture of a micro-lens array substrate from a third mold.

FIGS. 20 and 21 are cross sectional views to show another beam processing technique where a substrate 400 with a polycrystalline silicon (poly silicon), or amorphous silicon layer 405 formed thereon, is exposed to processing beams 410 from a bottom surface to define a plurality of beam processed zones 415 surrounded by a micro lens surface 420 with a micro lens curvature. The top portion of the substrate 405 above the beam-processed zones 415 is then etched away to expose the micro lens curvature surface 420 with a micro lens curvature at the bottom surface 420 of the beam processed zone 415. Again, as shown in FIGS. 22 to 24, the micro lens surface 415 supported on the substrate 405 can be applied as a master mode to make a second and third micro lens mode with concave and convex surfaces which can in turn be used to produce micro lens arrays of very small size by the use of mass production method.

A micro-lens-defining-substrate 300 or 400 is disclosed in this invention which includes a beam-processed zone 310 or 415 defining a micro lens surface, e.g., 420, surrounding the beam-processed zone 415 wherein the micro lens surface, e.g., 420, having a lens curvature provided for forming a micro lens thereon.

Furthermore, a micro-lens master mold supported on a micro-lens-defining substrate 300 is disclosed in the present invention. The micro lens master mold includes a beam-processed etch-away micro lens layer disposed over a top surface of the micro-lens-defining substrate 300 with a layer surface having a lens curvature.

The present invention further discloses a micro-lens master mold supported on a micro-lens-defining substrate 400 includes a beam-processed zone 415 in the micro-lens defining substrate 405. The micro lens master mold further includes a micro lens curvature layer 420 surrounding the beam-processed zone 415 with a curvature surface 420 having a lens curvature.

In addition, a method for manufacturing a micro-lens master mold on a substrate is disclosed in this invention which includes the steps of (a) forming a beam-processed zone 310 in the substrate for defining a micro lens surface having a lens curvature surrounding the beam-processed zone; and (b) processing the substrate 300 for exposing the micro lens surface. In a preferred embodiment, the step of forming a beam-processed zone in the substrate for defining a micro lens surface is a step of applying a radiation beam on the substrate for forming the beam-processed zone. In another preferred embodiment, the step of applying a radiation beam on the substrate for defining a micro lens surface is a step of applying a laser beam on the substrate for forming the beam-processed zone. In yet another preferred embodiment, the step of processing the substrate for exposing the micro lens surface is a step of etching away the beam-processed zone thus exposing the micro-lens surface as etched away surface. In yet another preferred embodiment, the step of processing the substrate for exposing the micro lens surface is a step of etching away a portion near a top surface of the substrate above the beam-processed zone thus exposing the micro-lens surface as non-etched surface.

Manufacture of Large Size Micro-lens Array Substrate by Repeatedly Patterning the Small Master Mold With three inventive process flows described above, a smaller original substrate, i.e., the master mold, is manufactured. The technology of IC manufacture can be easily applied to manufacture a smaller master mold in order to maintain a lower production cost The secondary and third molds are then fabricated by repeatedly produced by patterning the master molds. Mass production of large volume of micro lens arrays on substrates is therefore achieved by his invention. Many different kinds of applications are therefore feasible with large volume low cost micro lens arrays available. Specifically, according to this invention, the micro lens arrays are first implemented in a flat panel display system to broaden the view angle and to improve the display resolution and brightness. Additionally, the micro lens arrays are implemented to focus an ultraviolet light on a layer formed with a plurality of phosphor elements to excite the phosphors elements to lower the power requirement needed to excite the phosphors elements. Due to the small size and high density of the micro-lens array, the tolerance for the misalignment of the repeat patterning is large for these applications.

First Application of the above inventive process flows

Figure 25:
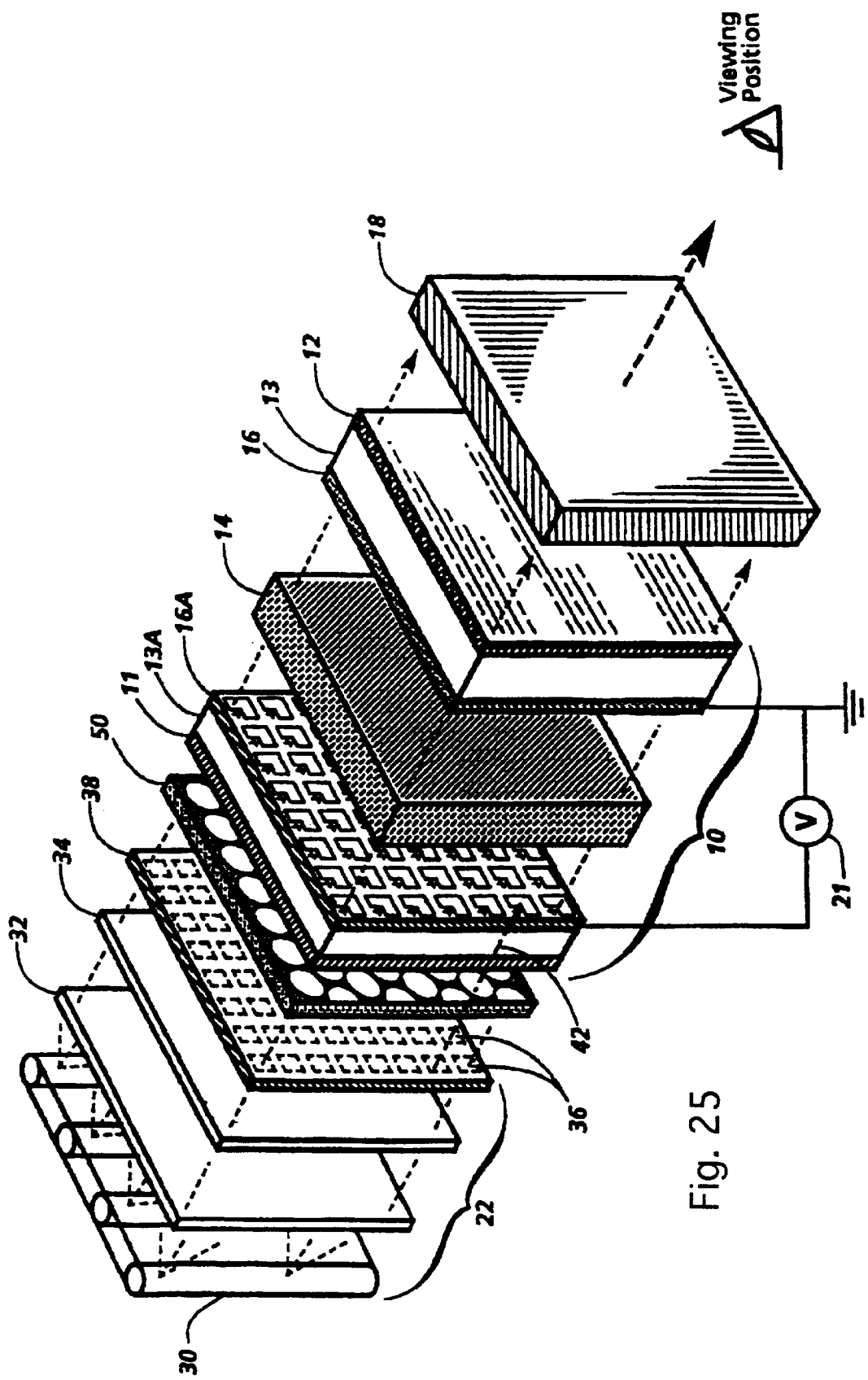
FIG. 25 is a schematic side view of a light source and its associated optical components in a conventional setup.

Recently, flat panel display (FPD) emerges as an alternative to cathode ray tube (CRT) because of its light weight, small size, and less power consumption. One of the leading FPDs is active matrix addressed color liquid crystal display (AMLCD) in which the matrix of liquid crystal pixels are arranged in a plurality of rows and columns. Each pixel consists of an active area and an inactive area. The active area is controlled by an active element, usually a thin film transistor (TFT) located at each pixel position. Such a matrix structure of active thin film transistors can be fabricated by the conventional IC manufacturing processes. The transistors are arranged in a matrix and deposited on a transparent substrate to form a planar matrix of sample-and-hold elements with associated transparent electrodes. Each element individually addressed by row and column in much the same way as a bit in memory. Referring to FIG. 25 a planar body of liquid crystal 13 is sandwiched between two parallel transparent substrate, the first substrate 12 having transparent common conductive electrode and the other 16 having the matrix of sample-and-hold elements with associated transparent electrodes. In AMLCD, illuminated means such as a lamp array 22 is disposed on the side of the matrix array of pixel 16A opposite the viewer. This scheme is called back-lighting. To view the image, the state of an individual pixel is controlled spatially by the application of a suitable voltage to gate lines and source lines.

The characteristics of the back-lighting scheme are very important to both the quality of the image. The most important characteristics in the design of the optimized back-lighting assembly include uniformity over large surface areas of the light and very bright illumination provided by the back light A technique employed to enhance the quality of the back-light is to operatively dispose a light collimating lens, such as fresnel lens, between the source of the back-light and matrix array of liquid crystal picture elements. This design expedient offers an intense, sharp image from a minimal number of lamps, while simultaneously providing a high degree of uniformity of projected radiation across the entire viewing surface of even large area display. However, due to the nature of collimated light, the view angle is limited. Typically, the displayed image can only be viewed within very narrow angle around the direction of the collimated beam. For the AMLCD display systems, in order to receive a good perception of the display, a viewer is restricted to gaze on the display in a directly straight-on manner. In order to overcome this restriction, as shown in FIG. 25, a conventional light diffuser 18 in the form of optical screen, such as ground glass, is used to diffuse the light exiting the display to enhance the viewing angle. Such an arrangement is quite limited in viewing angle improvement due to the concern that the brightness of the image decreases substantially as the viewing angle increases. Moreover, the deflection and reflection of the collimated light can lead to lower resolution, therefore less sharpness of the image. Also, the reflection of the collimated light can result in reduction in light intensity, therefore, light brightness.

Figure 26:
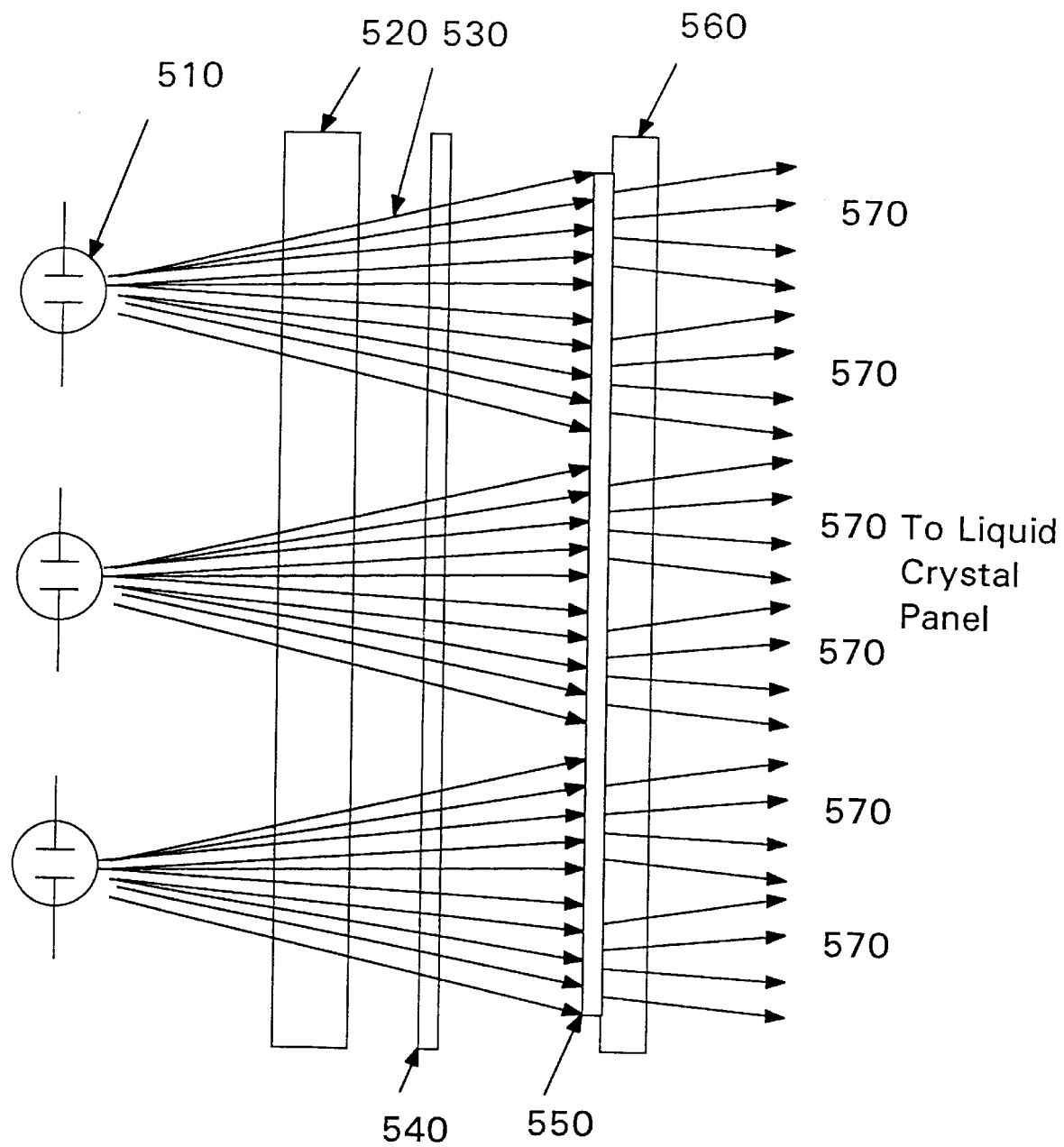
FIG. 26 is a schematic side view of a light source and its associated optical components in the presently inventive setup with a first micro-lens array plate.
Figure 27:
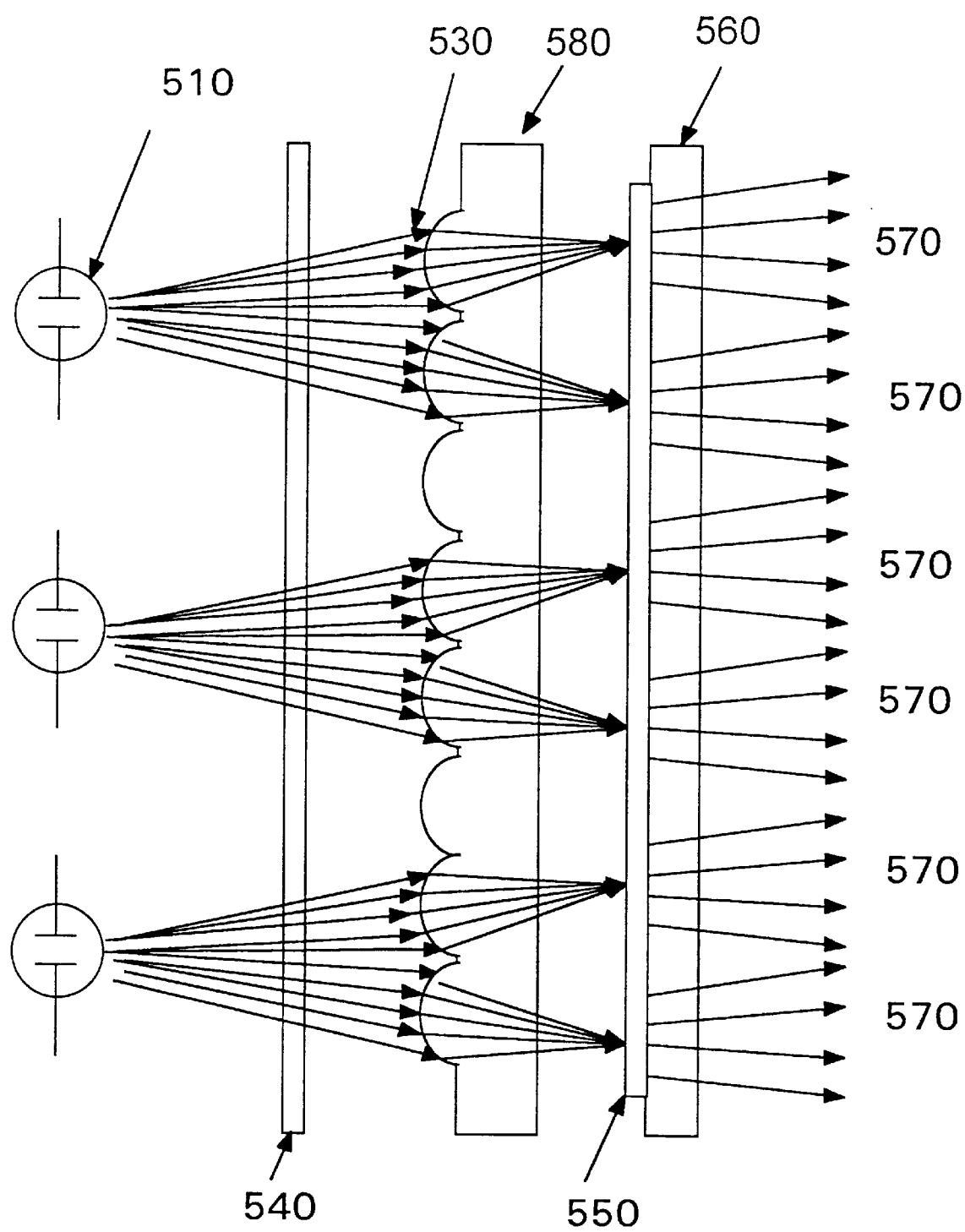
FIG. 27 is a schematic side view of a light source and its associated optical components in the presently inventive setup with a second convex micro-lens array plate.
Figure 28:
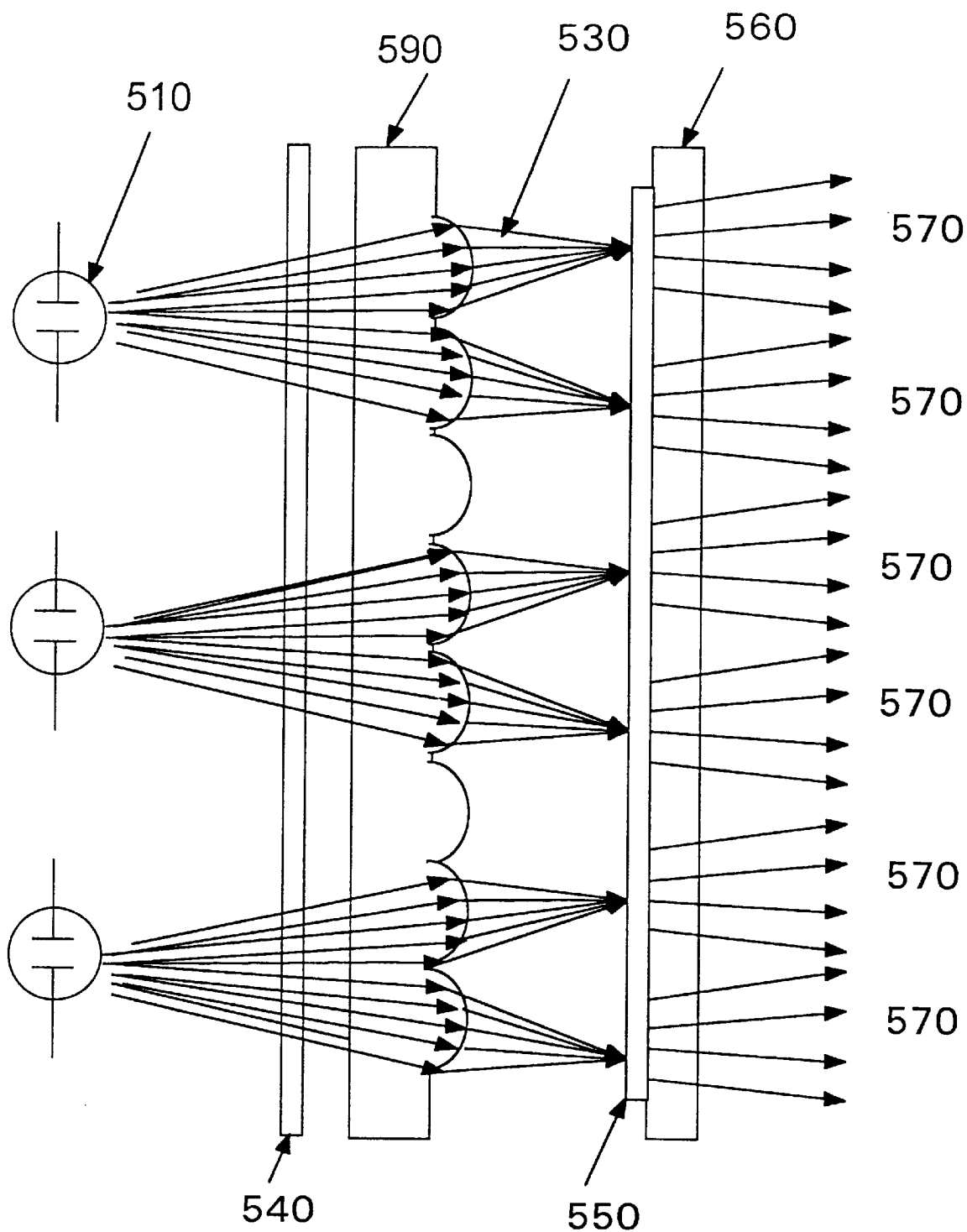
FIG. 28 is a schematic side view of a light source and its associated optical components in the presently inventive setup with a second concave micro-lens array plate.
Figure 29:
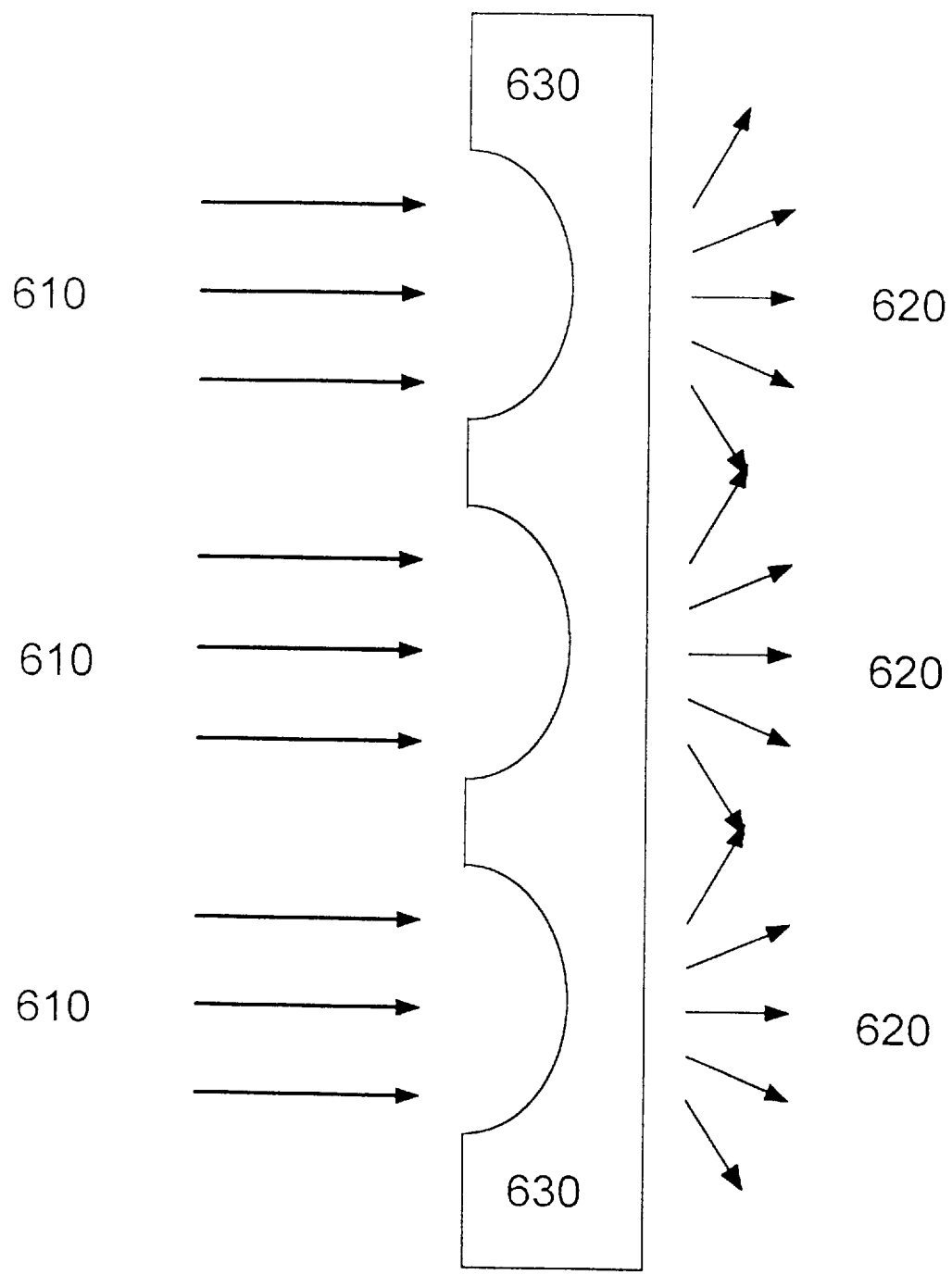
FIG. 29 is a schematic side view of a micro lens array of concave curvature randomly deflects coherent light beams into multiple directions.
Figure 30:
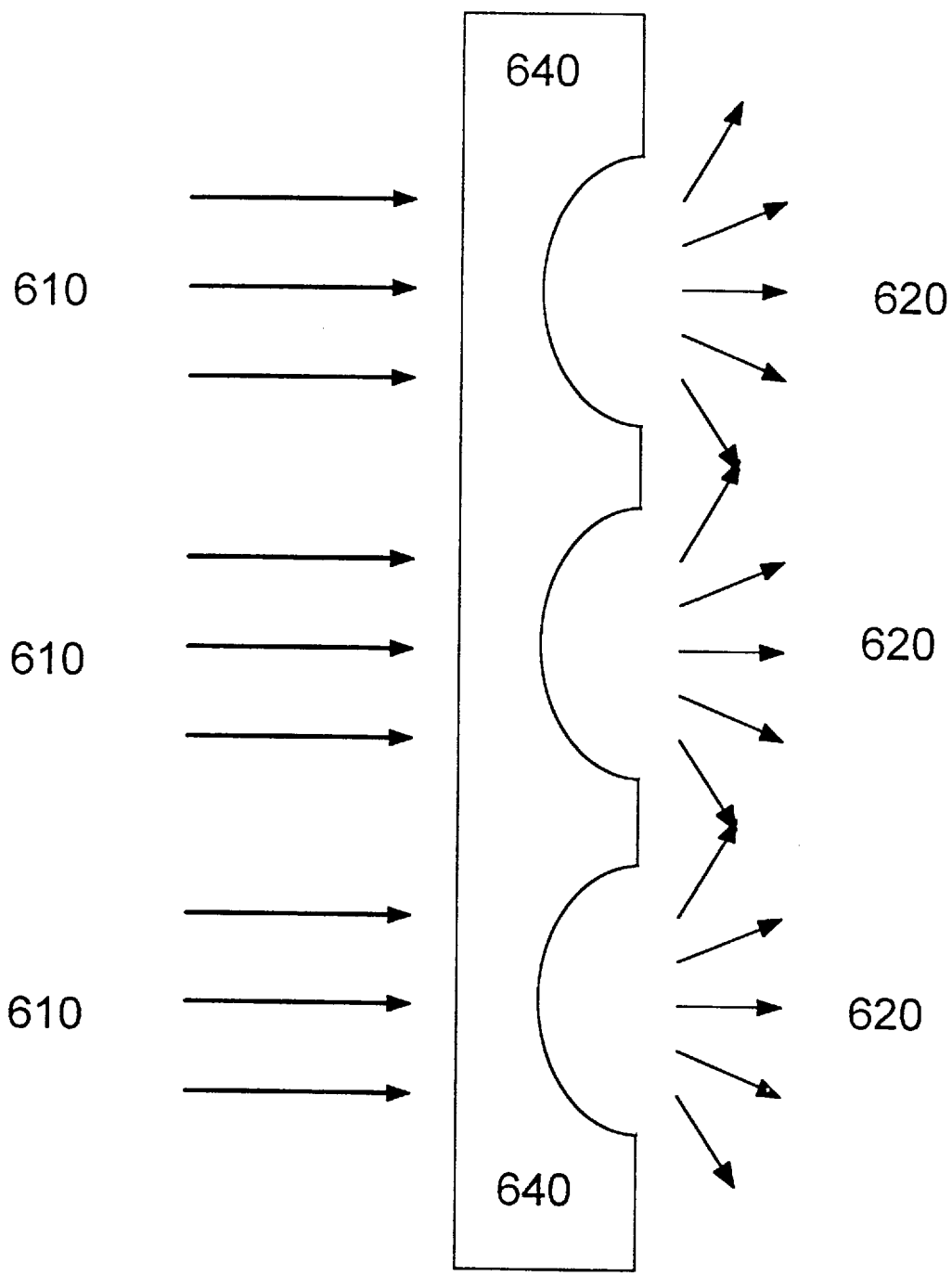
FIG. 30 is a schematic side view of a micro lens array of convex curvature randomly deflects coherent light beams into multiple directions.
Figure 31:
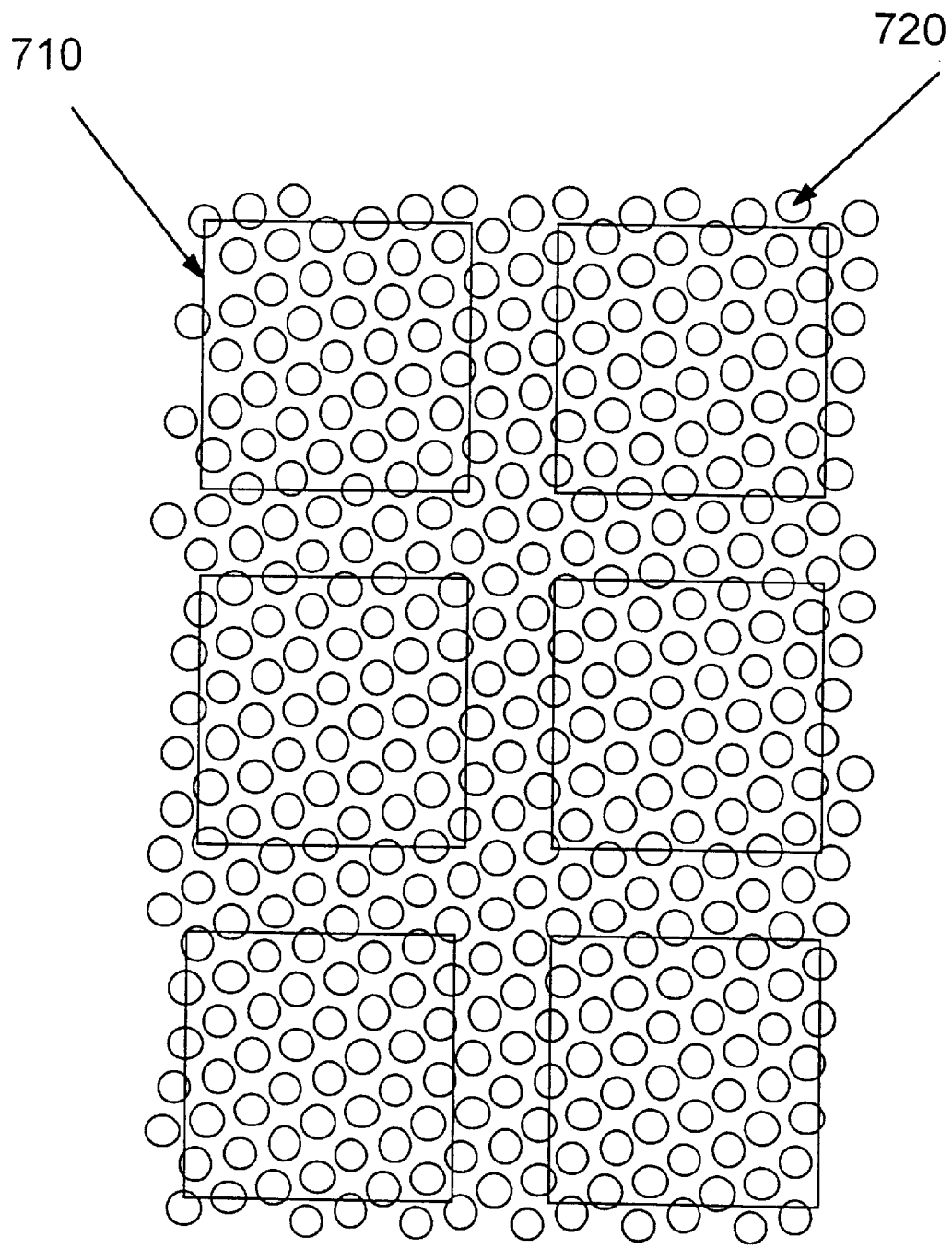
FIG. 31 is a top view of micro-lens array plate having a micro-lenses disposed in both the active areas of the pixels for image display and also in the non-active areas.
Figure 32:
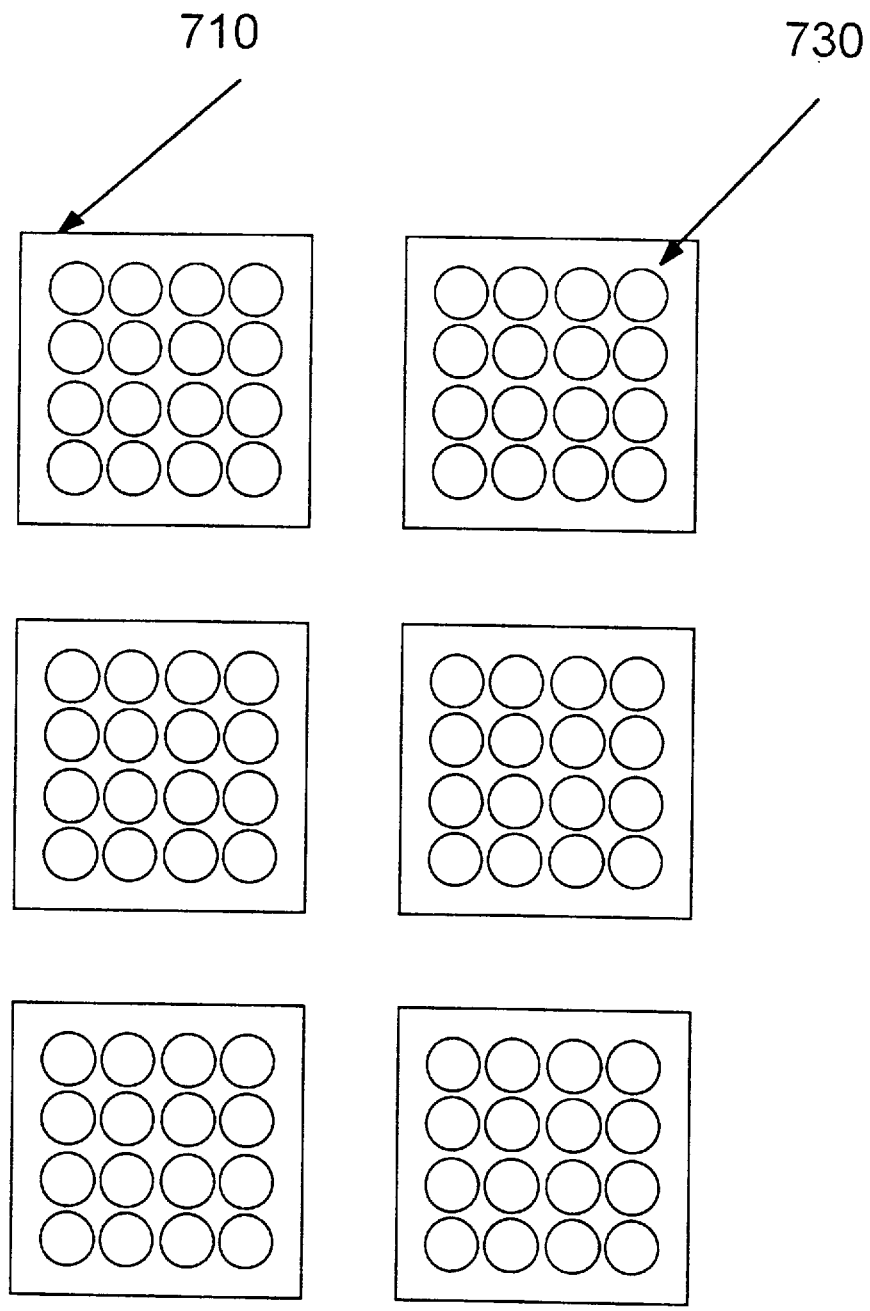
FIG. 32 is a top view of micro-lens array plate having a micro-lenses disposed in the active areas of the pixels for image display with a plurality of micro-lenses included in a single area for one pixel display.

The present invention provides a novel configuration for the AMLCD display system to overcome this difficulty. Specifically, the limitations caused by the above drawbacks can be minimized by using the micro-lens array substrate (or sheet). Referring to FIG. 26, a novel system configuration according to the present invention is to replace a conventional light diffuser 18 by a transparent micro-lens array substrate (or sheet) fabricated with the presently inventive process flows.

Several advantages are provided by such a novel AMLCD display system disclosed by the present invention. First, by using concave micro-lens with minimum focus length, for example, a spherical lens, the extremely wide viewing angle can be achieved since the incoming collimated light is deflected uniformly in all the directions. Secondly, unlike the conventional diffusers, the micro-lens array substrate (or sheet) is completely transparent due to no reflection from the substrate. Therefore, the light brightness is enhanced by this kind of substrate, resulting in less power consumption from the illumination source. Third, when the collimated light is reflected from the individual micro-lens, the light looks like illumination from the individual micro-lens. Since the process flow in the present invention is able to produce as small as 0.1 micron meter micro-lens with as small as 0.25 compared with lens distance, compared with around 10 micron meter of the cell size in the conventional FPD, apparent resolution is greatly improved. Fourth, because no diffuser is need in this scheme, the micro-lens array can be fabricated on one substrate 28 facing the viewer of two parallel transparent substrates sandwiching the liquid crystal or a micro-lens array sheet made with the present inventive process flow can be attached such a substrate to reduce the manufacturing cost. Even more importantly, since the size of micro-lens is much smaller than that of one pixel, one pixel can contain tens of micro-lenses, which means that no alignment is even needed between micro-lens printing and pixel cell printing. Therefore the manufacturing cost can be further reduced. Using micro-lens array substrate (or sheet) as diffuser is another important feature in this invention.

Second Application of the above inventive process flows

In AMLCD, illuminated means such as a lamp array is disposed on the side of the matrix array of pixel opposite the viewer. In addition, color filters are used for color rendition. The absorptive color filter scheme is a highly inefficient use of the energy contained in the light source, since it absorbs a substantially amount of the incident light source during color selection. Generating color without the use of light-absorbing filters provides an efficient solution to the display luminance problem. A backlight source composed of a patterned matrix of individual primary colored phosphor emitters in the same spatial configuration as the matrix of liquid crystal pixel elements in the LCD panel eliminates the need for the light-absorbing color filters; thereby providing more light directly into and through the liquid crystal light valves. Any suitable energy source may be used which provides either ultraviolet radiation or electrons for exciting the primary colored phosphor emitters to emit visible primary colored light.

Such a back-light source was described in U.S. Pat. No. 4,799,050. FIG. 25 illustrates the light source comprised of a single or multiple lamps 30 and associated optical components, collectively designated as light source 22. Fluorescent lamp 30 is positioned at the back-plane of the liquid crystal light valve. The output of lamp 30 comprises ultraviolet radiation, rather than visible light, and fluorescent lamp 30 is chosen for its ability to excite phosphor material to emit visible light. The electrodes of lamp 30 are enclosed within a clear envelope of quartz or other UV transmissive material, and plate 32, which forms the rear surface of the light valve, is also preferable quartz and transmits UV radiation. A diachronic selective filter layer 34 which may be deposited on the inner surface of plate 32 is fabricated of material that is transmissive to UV radiation and reflect visible light Next in alignment, and closely spaced to the first diachronic filter 34 is a second diachronic filter 38 which has deposited on it, on the surface closest to first diachronic filter 34, a phosphor layer 36 comprising a matrix arrangement of a plurality of discrete phosphor elements. The phosphor layer converts UV radiation energy into visible light.

However, if the sequence of the components is rearranged and the plate 32 is replaced with a micro-lens array plate 41 manufactured by using presently inventive process flows or other methods, the power consumption of the lamps 30 will be largely reduced. After rearrangement, the first diachronic filter 34 is deposited on the side of the micro-lens array plate close to the lamps 30. In this setup, the micro-lens array is focused on the phosphor layer. After focus, the intensity of UV light on the phosphors element is much higher than that of unfocused one. Since a threshold UV light intensity is required to excite the phosphors elements, high intensity of the focused UV light means that only lower power lamps are needed to excite the phosphors elements. Further, due to the small size and high density of the micro-lens array manufactured with the presently inventive process flows, and also the relatively large size of the phosphor elements, the brightness of the emitted visible light should sufficient since tens or hundreds of the focused UV spots can contained in one phosphor element.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

I claim:

1. A method for manufacturing a lens-curvature surface on a substrate comprising:

forming a lens-curvature window defining layer on said substrate;

opening a lens-curvature window in said lens-curvature window defining layer; and forming a lens-curvature layer in said lens-curvature window with a layer surface having a lens curvature resulting from a reaction expansion with a stress redistribution during a formation of said layer surface in said lens curvature window.

2. The method for manufacturing said lens-curvature surface of claim 1 wherein:

said step of forming a lens curvature layer is a step of forming an oxidation layer in said lens-curvature window with a layer surface having a lens curvature resulting from said reaction expansion with a stress redistribution during a formation of said oxidation layer.

3. The method for manufacturing said lens-curvature surface of claim 2 wherein:
   said step of forming a lens-curvature window defining layer on said substrate is a step of forming said lens-curvature window defining layer including an oxidation stopping layer.

4. The method for manufacturing said lens-curvature surface of claim 1 wherein:
   said step of opening said lens-curvature window in said lens-curvature window defining layer is a step of opening said window by applying a photolithography process to define a shape and size of said lens-curvature window.

5. The method of claim 1 further comprising:
   forming a micro lens by employing said lens-curvature surface formed in said lens-curvature window as a mold thus forming a micro lens have a lens curvature surface of a reverse curvature relative to said lens curvature of said lens-curvature surface in said lens-curvature window.

6. A lens-curvature window supported on a substrate with a lens-curvature window defining layer disposed thereon, said lens-curvature window comprising:
   an opening having a predefined lens-curvature-dependent width and depth ranging from few micrometers to sub-micrometers in said lens-curvature window defining layer provided for forming a lens-curvature surface therein.

7. The lens-curvature window of claim 6 wherein:
   said lens-curvature window defining layer including an oxidation stopping layer.

8. A lens-curvature surface supported on a substrate with a lens-curvature window defining layer disposed thereon, said lens-curvature surface comprising:
   an opening having a predefined lens-curvature-dependent width and depth ranging from few micrometers to sub-micrometers in said lens-curvature window defining layer; and
   an oxide layer disposed in said opening having a thicker central portion and thinner edge portion thus defining said lens-curvature surface in said substrate with a lens-curvature.

9. The lens-curvature surface of claim 8 wherein:
   said oxide layer in said opening having a convex surface.

10. The lens-curvature surface of claim 8 wherein:
    said lens-curvature surface constituting a concave surface.

11. The lens curvature surface of claim 8 further comprising:
    at least a second opening in said lens-curvature window defining layer; and
    an oxide layer disposed in said second opening having a thicker central portion and thinner edge portion thus defining a second lens-curvature surface in said substrate with a lens-curvature.

12. The lens curvature surface of claim 11 wherein:
    said oxide layer in each of said openings having a convex surface.

13. The lens curvature surface of claim 11 wherein:
    each of said lens curvature surfaces in said opening constituting a concave layer surface.

14. A method for manufacturing a lens-curvature surface on a substrate comprising:
    forming on said substrate a lens-curvature window defining layer including an etch stopping layer therein;
    opening a lens-curvature window having a predefined lens-curvature-dependent width and depth ranging from few micrometers to sub-micrometers in said lens-curvature window defining layer; and
    applying an etch through said lens-curvature window for forming a lens-curvature surface in said lens-curvature window.

15. The method for manufacturing a lens-curvature surface of claim 14 wherein:
    said step of applying an etch through said lens curvature window is a step of applying a wet etching process to form said lens surface over said top surface of said substrate in said lens-curvature window.

16. The method for manufacturing a lens-curvature surface of claim 14 wherein:
    said step of applying an etch through said lens curvature window is a step of applying a dry etching process to form said lens surface over said top surface of said substrate in said lens-curvature window.

17. The method for manufacturing a lens-curvature surface of claim 14 wherein:
    said step of applying an etch through said lens curvature window is a step of applying multiple dry and wet etching processes to form said lens surface over said top surface of said substrate in said lens curvature window.

18. The method for manufacturing a lens-curvature surface of claim 14 wherein:
    said step of opening a lens-curvature window in said lens-curvature window defining layer is a step of opening said window having a predefined lens-curvature-dependent width and depth ranging from few micrometers to sub-micrometers by applying a photolithography process to define said lens-curvature window.

19. The method for manufacturing a lens-curvature surface of claim surface of claim 14 further comprising a step of:
    opening at least a second lens-curvature window in said lens-curvature window defining layer; and
    applying said etch through said lens-curvature windows for forming at least two lens-curvature surfaces in said lens curvature windows having a lens curvature over a top surface of said substrate.

20. The method for manufacturing a lens-curvature surface of claim 19 further comprising a step of:
    applying said lens-curvature surfaces on said substrate as a mold to make a micro-lens array.

21. The method for manufacturing a lens-curvature surface of claim 19 further comprising a step of:
    applying said lens-curvature surfaces on said substrate as a mold to make a micro-lens mold array for making a micro lens array.

22. A micro-lens mold supported on a lens curvature defining substrate comprising:
    a beam processed etch-away lens-curvature layer disposed over a top surface of said lens curvature defining substrate with a layer surface having a lens curvature.

23. The micro-lens mold of claim 22 further comprising:
    an array of micro-lens molds includes a plurality of micro-lens molds of claim 22 disposed on said lens-curvature defining substrate.

24. The micro-lens mold of claim 23 wherein:
    each of said array of micro-lens molds having a dimension ranging from sub-microns to few microns.

25. A method for making a micro lens mold on a substrate comprising:
    applying an integrated-circuit (IC) manufacturing process for manufacturing said micro lens mold.

26. The method for making said micro lens mold of claim 25 further comprising:

applying said integrated-circuit (IC) manufacturing process for manufacturing a array of said micro lens molds of claim 25 on said substrate.

27. The method for making said micro lens mold of claim 25 wherein:

said step of applying said integrated-circuit (IC) manufacturing process includes a step of applying a photolithography process for defining a shape and size of said micro lens mold.

28. The method of claim 27 wherein:

said step of applying a photolithography process is a step of defining said size of said micro lens mold having a dimension ranging from sub-micron to few microns.

29. The method of claim 26 further comprising a step of:

applying said array of micro lens molds for manufacturing a array of micro lenses on a transparent film.

30. The method of claim 26 wherein:

said step of manufacturing said array of micro lenses is a step of arranging a group of said micro lenses to cover an area of one display pixel.

31. A method for forming a lens curvature surface in a lens curvature window comprising a step of:

forming an oxidation layer in said lens curvature window with a lens-curvature resulting from an oxidation process in forming said oxidation layer.

32. The method of claim 31 further comprising:

forming an array of oxidation layers of said claim 31 thus forming an array of lens-curvature surfaces.

33. The method of claim 32 further comprising:

employing said array of lens-curvature surfaces as a mold for making an array of micro lenses.

34. The method claim 33 further comprising:

making said array of micro lenses on a transparent film.

35. The method of claim 34 further comprising:

making said array of micro lenses on said transparent film and arranging a group of said micro lenses to cover a display pixel.

* * * * *